US009386724B2

(12) United States Patent
Matsunaga et al.

(10) Patent No.: US 9,386,724 B2
(45) Date of Patent: Jul. 5, 2016

(54) VAPOR PHASE COOLING APPARATUS AND ELECTRONIC EQUIPMENT USING SAME

(75) Inventors: Arihiro Matsunaga, Tokyo (JP); Hitoshi Sakamoto, Tokyo (JP); Minoru Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 566 days.

(21) Appl. No.: 13/824,908

(22) PCT Filed: Aug. 31, 2011

(86) PCT No.: PCT/JP2011/069706
§ 371 (c)(1),
(2), (4) Date: Mar. 18, 2013

(87) PCT Pub. No.: WO2012/043117
PCT Pub. Date: Apr. 5, 2012

(65) Prior Publication Data
US 2013/0188314 A1    Jul. 25, 2013

(30) Foreign Application Priority Data
Sep. 30, 2010    (JP) ................. 2010-222514

(51) Int. Cl.
| H05K 7/20 | (2006.01) |
|---|---|
| H01L 23/427 | (2006.01) |
| F28D 15/02 | (2006.01) |
| F28F 13/06 | (2006.01) |
| F28F 3/02 | (2006.01) |
| F28F 13/18 | (2006.01) |

(52) U.S. Cl.
CPC .......... *H05K 7/20363* (2013.01); *F28D 15/025* (2013.01); *F28D 15/0233* (2013.01); *F28D 15/0275* (2013.01); *F28F 3/02* (2013.01); *F28F 13/06* (2013.01); *F28F 13/18* (2013.01); *H01L 23/427* (2013.01); *H01L 2924/0002* (2013.01)

(58) Field of Classification Search
CPC ............ H05K 7/20763; H05K 1/0203; H05K 7/20254; H05K 7/20263; H05K 7/20318; G06F 1/20
See application file for complete search history.

(56) References Cited

FOREIGN PATENT DOCUMENTS

| JP | 50-116283 A | 9/1975 |
|---|---|---|
| JP | 57-101293 A | 6/1982 |
| JP | 10-128531 A | 5/1998 |
| JP | 2001-077259 A | 3/2001 |
| JP | 2003-258475 A | 9/2003 |
| JP | 2004-349652 A | 9/2004 |
| JP | 2007-109695 A | 4/2007 |
| WO | WO 2010/084717 A1 | 7/2010 |

*Primary Examiner* — Robert J Hoffberg
*Assistant Examiner* — Hung Dang
(74) *Attorney, Agent, or Firm* — Foley & Lardner LLP

(57) ABSTRACT

A vapor phase cooling apparatus (10) includes: a housing (11) including a heat receiver (14a) configured to receive heat generated by an electronic component (50) that is a heat generating source, the electronic component (50) being connected to a vertical outer surface on the +Z side of the housing, the housing including an internal space for enclosing refrigerant; and a first heat sink (21) and a second heat sink (22) that are disposed on the +Y side and the −Y side from the electronic component (50) and that dissipate heat to the outside. Both ends of the first heat sink (21) and the second heat sink (22) in X direction extend further along the surface on the +Z side than both ends of the heat receiver (14a) in X direction.

9 Claims, 18 Drawing Sheets

VAPOR PHASE COOLING APPARATUS AND ELECTRONIC EQUIPMENT USING SAME

This application is the National Phase of PCT/JP2011/069706, filed Aug. 31, 2011, which claims priority to Japanese Application No. 2010-222514, filed Sep. 30, 2010, the disclosures of which are hereby incorporated by reference in their entirety.

TECHNICAL FIELD

The present invention relates to a vapor phase cooling apparatus and an electronic equipment using the vapor phase cooling apparatus.

BACKGROUND ART

Recently, the degree of integration of electronic components (for example, IC and LSI) used in electronic equipment such as a computer has been increasing and accordingly, electronic equipment has been downsized and thinned. However, downsizing and thinning an electronic equipment reduces space inside the housing, and as a result, placing a cooling unit near the electronic component becomes difficult. Especially, an electronic component whose heat generation amount is high requires a larger cooling unit corresponding to the heat generation amount, which requires more space. Therefore, Patent Literatures 1 and 2 disclose a vapor phase cooling apparatus that utilizes a phase change of refrigerant to move heat to a different place where cooling is performed.

In the vapor phase cooling apparatus disclosed in Patent Literatures 1 and 2, an electronic component is disposed on a vertical surface of the vapor phase cooling apparatus. When the electronic component generates heat, the generated heat is conducted to the refrigerant, which, in turn, changes its phase from liquid to vapor (boils). When liquid refrigerant becomes vapor refrigerant, the vapor refrigerant moves upward while retaining heat, due to a difference in density from the surrounding liquid refrigerant. Above the electronic component is disposed a heat sink, and the resulting vapor refrigerant enters into the heat sink, where the vapor refrigerant changes its phase from vapor to liquid (condenses), thereby cooling the electronic component.

PRIOR ART LITERATURE

Patent Literature
Patent Literature 1: Unexamined Japanese Patent Application Kokai Publication No.
2004-349652
Patent Literature 2: Unexamined Japanese Patent Application Kokai Publication No. 2001-077259

DISCLOSURE OF THE INVENTION

Problem to be Solved by the Invention

However, the vapor phase cooling apparatus described in Patent Literature 1 cannot produce a sufficient cooling effect unless the apparatus has a certain posture. For example, where the electronic equipment with the vapor phase cooling apparatus is movable, the vapor phase cooling apparatus may have a posture other than the above certain posture depending on the state in which this electronic equipment is used. In this case, since a heat sink is not necessarily disposed above a heat receiver, the boiling refrigerant has difficulty entering the heat sink, and as a result, cooling effect may not be produced.

In the vapor phase cooling apparatus described in Patent Literature 2, heat sinks are disposed above and below the heat receiver. Therefore, a cooling effect can be produced even if the vapor phase cooling apparatus is upside down. However, if the vapor phase cooling apparatus is tilted around an axis perpendicular to a surface on which the electronic component is disposed or lies in a horizontal direction, neither of the heat sinks may be above the heat receiver and, as a result, a sufficient cooling effect may not be produced.

The present invention was made in view of the above circumstances, and has an objective to provide a vapor phase cooling apparatus that can exert a sufficient cooling effect on an electronic component even if the vapor phase cooling apparatus is tilted around an axis perpendicular to a surface on which the electronic component is disposed or lies in a horizontal direction, as well as an electronic equipment using the vapor phase cooling apparatus.

Means for Solving the Problem

In order to achieve the above objective, a vapor phase cooling apparatus according to a first aspect of the present invention includes:

a housing including a heat receiver to receive heat generated by an electronic component that is a heat source, the electronic component being connected to the first surface that is a vertical outer surface of the housing, the housing having an internal space for enclosing the refrigerant; and a first heat sink and a second heat sink that are disposed above and below the heat receiver, respectively, the first and second heat sinks dissipating the heat to the outside, both ends of the first heat sink and both ends of the second heat sink in a horizontal direction are positioned exterior of both ends of the heat receiver in a horizontal direction.

An electronic equipment according to a second aspect of the present invention includes:

an electronic component that becomes a heat source by consuming power;

the vapor phase cooling apparatus according to the first aspect in which the electronic component and a heat receiver are thermally connected to each other; and a cooling wind supply unit configured to supply cooling wind toward a first heat sink and a second heat sink of the vapor phase cooling apparatus.

Effects of the Invention

According to the present invention, a first heat sink and a second heat sink are disposed above and below a heat receiver. Therefore, even if a vapor phase cooling apparatus is tilted around an axis perpendicular to the surface on which an electronic component is disposed, part of either of the first and second heat sinks is disposed above the heat receiver. In addition, since both ends of the first and second heat sinks in a horizontal direction are positioned exterior of both ends of the heat receiver in a horizontal direction, a part of the first and second heat sinks are above the heat receiver even if the vapor phase cooling apparatus lies in a horizontal direction. Therefore, a cooling effect on the electronic component can be produced.

MODES FOR CARRYING OUT THE INVENTION

First Embodiment

Hereinafter, the first embodiment of the present invention will be described with reference to FIGS. 1 to 10. In drawings, XZ plane is a horizontal plane, and the direction of Y axis is vertical direction.

Figure 1:
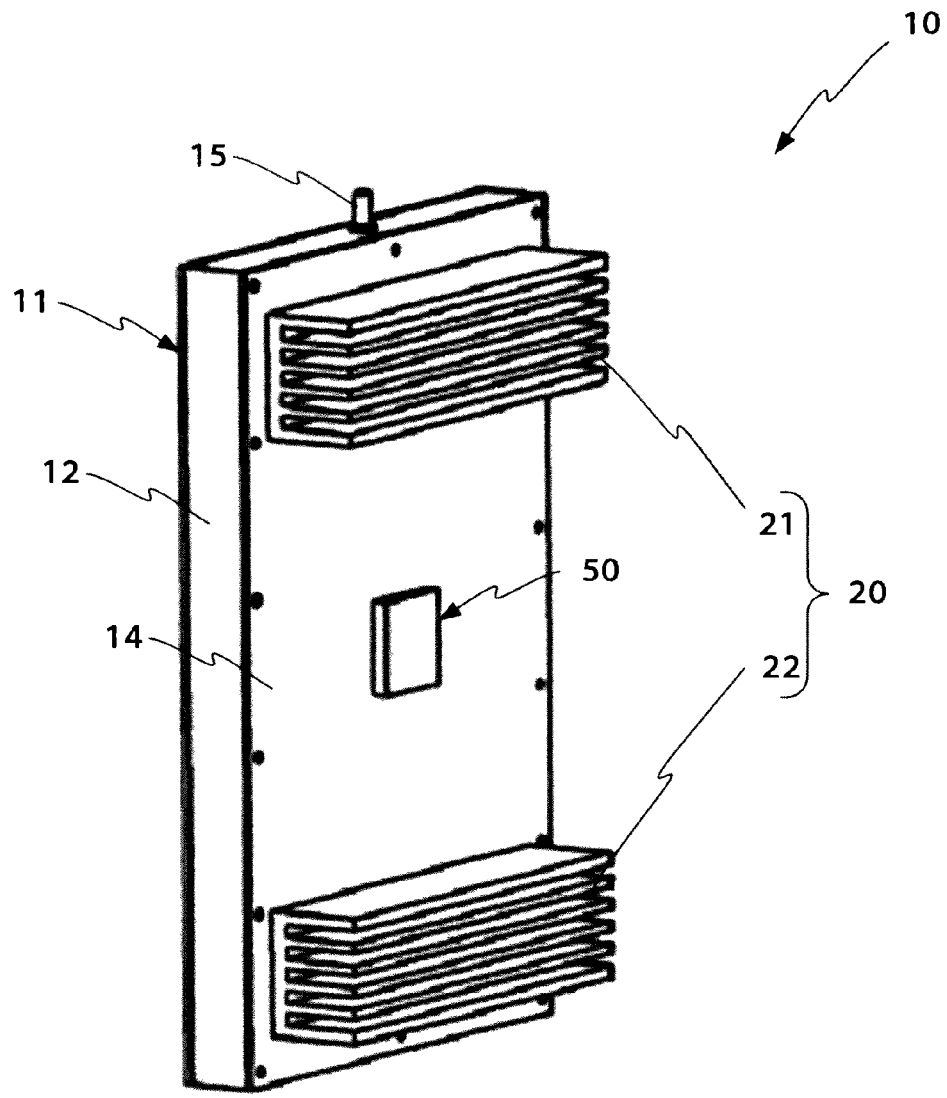
FIG. 1 is a perspective view of a vapor phase cooling apparatus according to a first embodiment of the present invention.

A vapor phase cooling apparatus 10 is an apparatus for cooling an electronic component 50 that generates heat by consuming power, as illustrated in FIG. 1. The vapor phase cooling apparatus 10 is mounted to an electronic equipment provided with the electronic component 50. The electronic component 50 is not a component composing the vapor phase cooling apparatus 10, but in drawings, the electronic component 50 is represented by a full line in the state of being mounted to the vapor phase cooling apparatus 10. The electronic component 50 is, for example, IC or LSI, and is thermally connected to the vapor phase cooling apparatus 10 with a heat conduction grease or heat conduction sheet that is not illustrated. The vapor phase cooling apparatus 10 includes a housing 11, a heat sink unit 20 fixed to a surface of the housing 11, and refrigerant 30 enclosed in the housing 11 (see FIG. 3).

Figure 2:
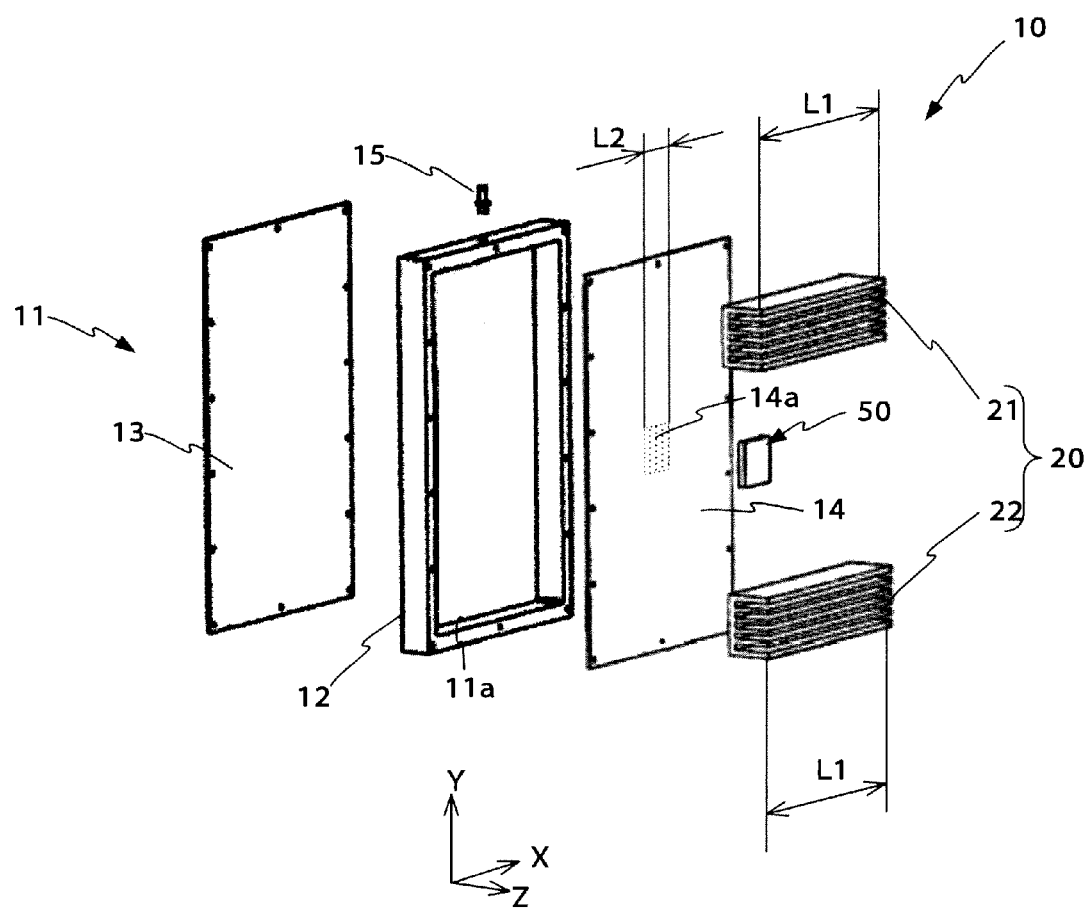
FIG. 2 is an exploded perspective view of the vapor phase cooling apparatus according to the first embodiment.

The housing 11 is a rectangular-plate shaped case whose longer direction is Y direction, and the electronic component 50 is disposed on a vertical surface (a heat conductive plate 14) of the +Z side of the housing 11. This housing 11 includes a quadrangle shaped frame 12, a sealing plate 13 that covers an opening at the −Z side of the frame 12, and the heat conductive plate 14 that covers an opening at the +Z side thereof, as illustrated in FIG. 2.

The frame 12 is made of metal having a high heat conductivity, such as copper and aluminum. At the end of the +Y side of the frame 12 is formed a refrigerant inlet 15. The refrigerant inlet 15 includes a valve that is not illustrated. The valve opens and closes the refrigerant inlet 15.

The sealing plate 13 and heat conductive plate 14 are made of metal having a high heat conductivity such as copper and aluminum, like the frame 12. Around the center of the heat conductive plate 14 is connected the electronic component 50 that is a heat source. The vicinity of the position at which the electronic component 50 is connected on the surface of the heat conductive plate 14 is the portion receiving heat from the electronic component 50. This portion is called a heat receiver 14a.

The frame 12, sealing plate 13 and heat conductive plate 14 are separately formed. Then, the sealing plate 13 and heat conductive plate 14 are attached to the frame 12 by brazing, which forms an internal space 11a in the housing 11. This internal space 11a is in communication with the outside of the housing 11 through the refrigerant inlet 15 formed on the frame 12.

A surface (−Z side surface) of the heat conductive plate 14, of surfaces that define the internal space 11a of the housing 11, was subjected to surface roughening to reach a predetermined roughness. This roughness is, for example, 1 μm to 100 μm in arithmetic mean roughness Ra.

The heat sink unit 20 is a member to dissipate heat from the electronic component 50 to the outside. The heat sink unit 20 includes a first heat sink 21 fixed to the +Y side from the heat receiver 14a and a second heat sink 22 fixed to the −Y side from the heat receiver 14a. The first heat sink 21 and second heat sink 22 are made of metal having a high heat conductivity, such as copper and aluminum. The first heat sink 21 and second heat sink 22 are fixed by, for example, brazing to the same surface as an outer surface of the housing 11 on which the electronic component 50 is disposed. The first heat sink 21 and second heat sink 22 are fixed to approximately symmetrical positions relative to the electronic component 50.

These first heat sink 21 and second heat sink 22 both have equivalent approximately-rectangular shapes. Both ends in X direction of the first heat sink 21 are positioned +X side and −X side, respectively, of positions of both ends in X direction of the heat receiver 14a. Similarly, both ends in X direction of the second heat sink 22 are positioned +X side and −X side, respectively, of positions of both ends in X direction of the heat receiver 14a. That is, a length in X direction L1 of the first heat sink 21 and second heat sink 22 and a length in X direction L2 of the heat receiver 14a have a relationship: L1>L2.

The first heat sink 21 and second heat sink 22 have fins that are parallel to the X axis. Similarly, the second heat sink 22 has fins that are parallel to the X axis.

Figures 3A, 3B:
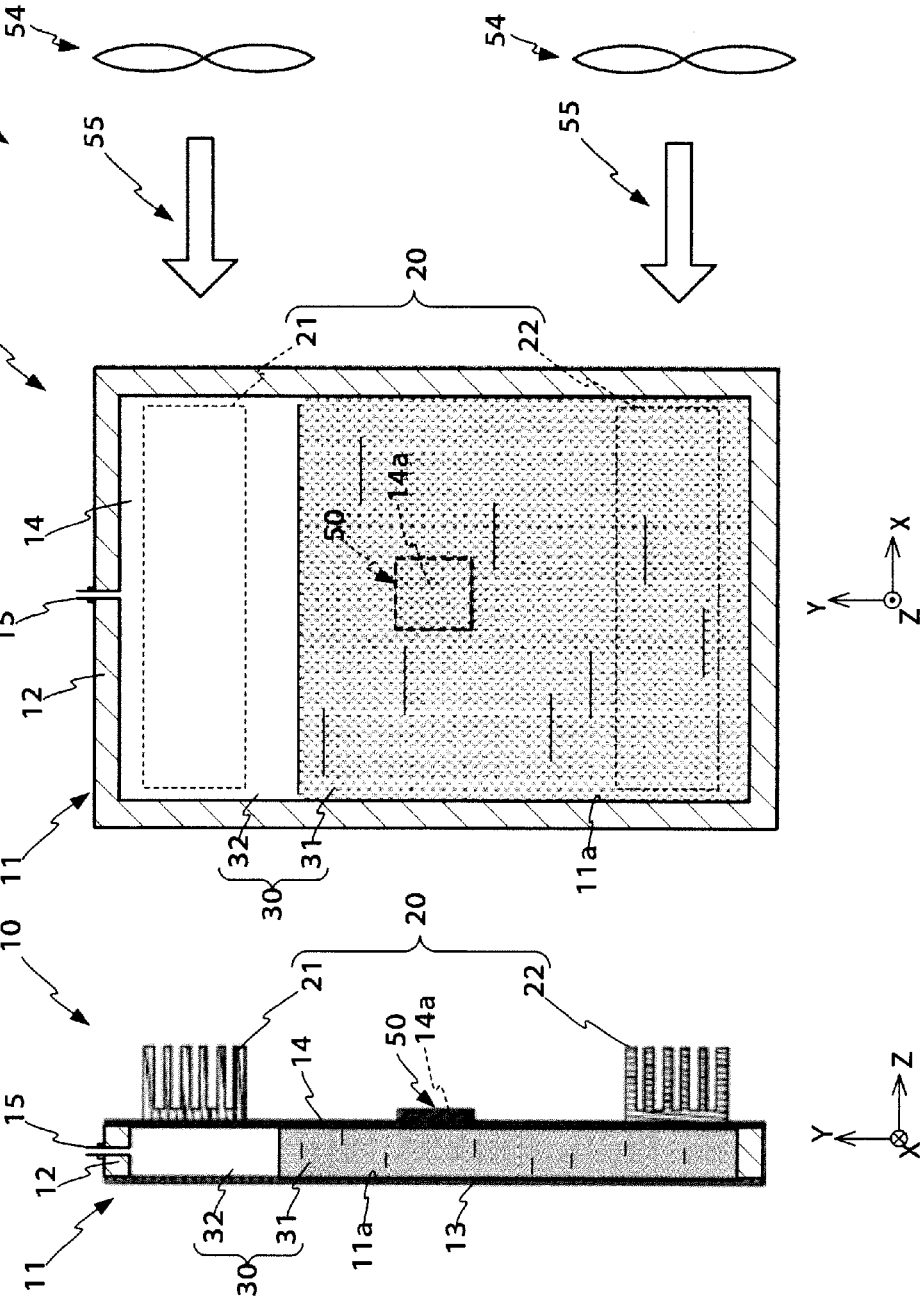
FIGS. 3A and 3B are a cross-sectional view 1 and a cross-sectional view 2 of the vapor phase cooling apparatus according to the first embodiment, respectively.

In the internal space 11a of the housing 11 is enclosed the refrigerant 30 to receive heat from the heat receiver 14a, as illustrated in FIGS. 3A and 3B. The refrigerant 30 is composed of liquid refrigerant 31 and vapor refrigerant 32. Hereinafter, where the liquid refrigerant 31 and vapor refrigerant 32 are not differentiated, the term, the refrigerant 30 will be used. Material of the refrigerant 30 is water, an insulating organic refrigerant, or the like. Where an insulating organic refrigerant is used as the refrigerant 30, even if the refrigerant 30 attaches to the electronic component 50 due to breakage of the housing 11 or the like, the electronic component 50 can be reused, which is an advantage.

The refrigerant 30 is filled through the refrigerant inlet 15 into the internal space 11a of the housing 11. Once the refrigerant 30 has been filled into the internal space 11a, vacuuming is performed. Finally, a valve of the refrigerant inlet 15 is closed to enclose the refrigerant 30 in the internal space 11a.

An electronic equipment 1 provided with the electronic component 50 includes a cooling wind supply unit 54, as illustrated in FIG. 3B. This cooling wind supply unit 54 supplies cooling wind 55 toward the heat sink unit 20. The cooling wind supply unit 54 is, for example, an axial fan or a centrifugal fan. The cooling wind 55 is supplied in a direction that is parallel to a direction along which fins are formed so as to pass through between the fins.

Figure 4:
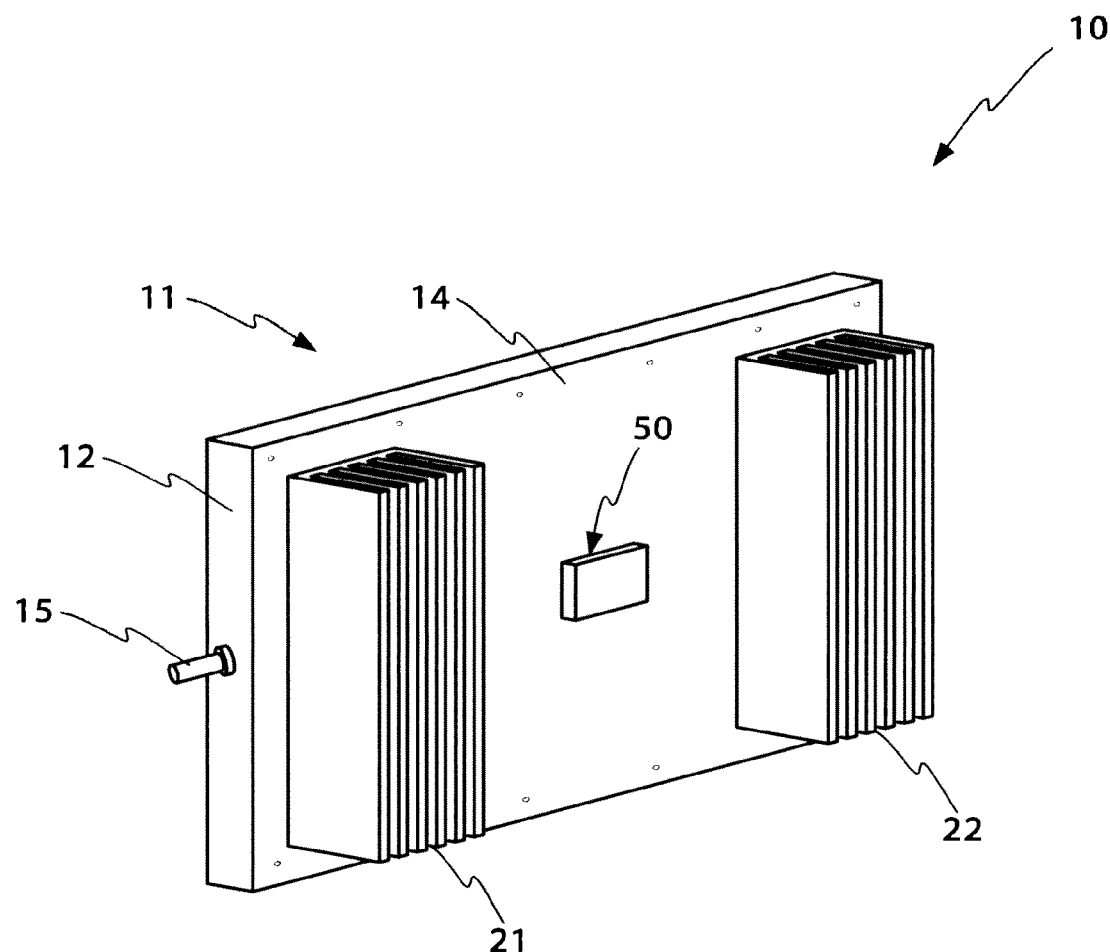
FIG. 4 is a perspective view for describing a state in which the vapor phase cooling apparatus is used according to the first embodiment.

The above vapor phase cooling apparatus 10 is mounted on the electronic equipment 1, for example, in such a way that the first heat sink 21 is disposed above the electronic component 50, as illustrated in FIG. 1, and is used in this posture. The position of the vapor phase cooling apparatus 10 varies depending on the state in which the electronic equipment 1 with the vapor phase cooling apparatus 10 is used: a posture in which the second heat sink 22 is above the electronic component 50, a posture tilted around Z-axis from the posture in FIG. 1 or a posture of lying in a horizontal direction as illustrated in FIG. 4.

Figure 5:
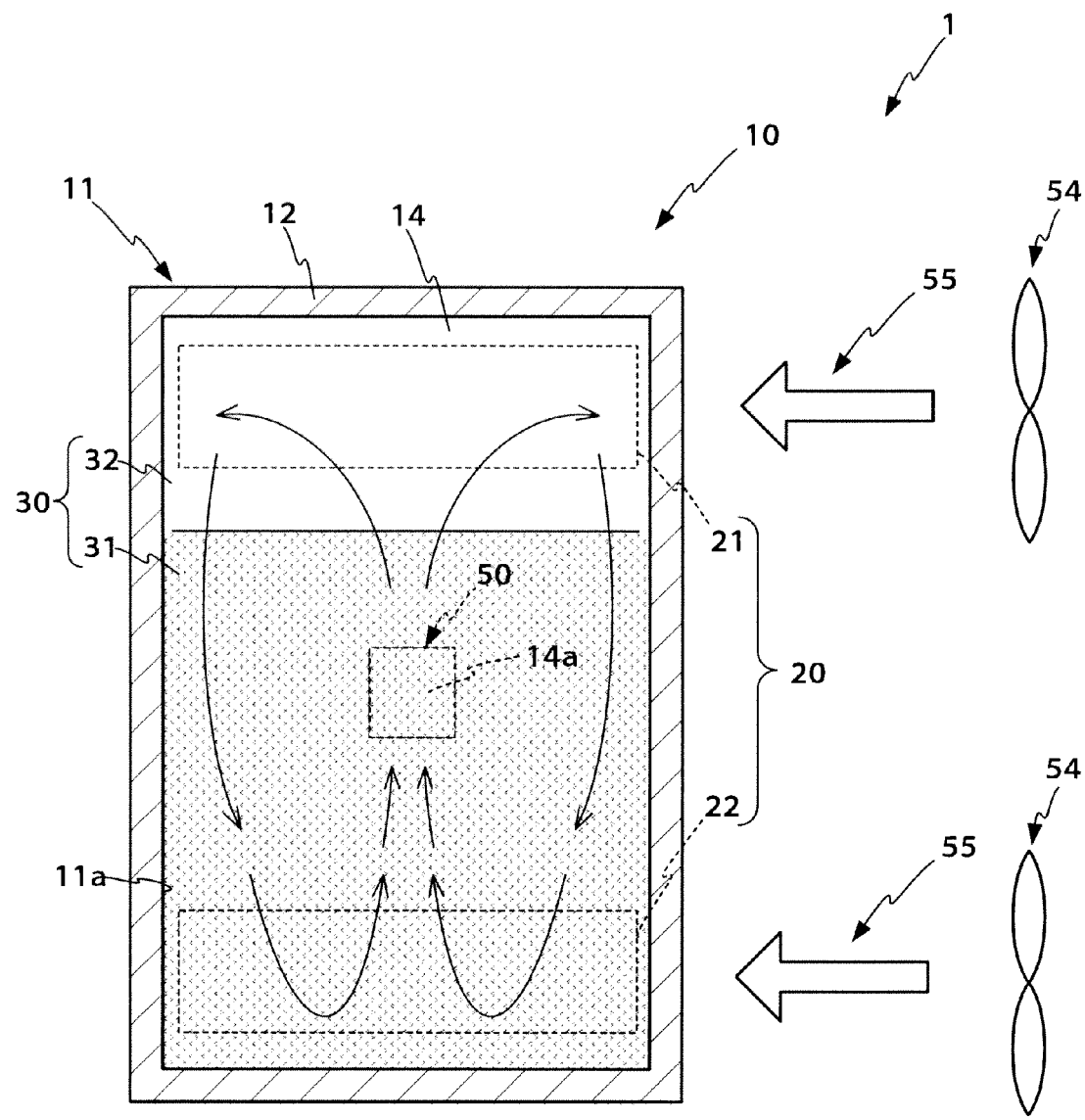
FIG. 5 is a diagram 1 for describing operation of the vapor phase cooling apparatus according to the first embodiment.
Figure 6:
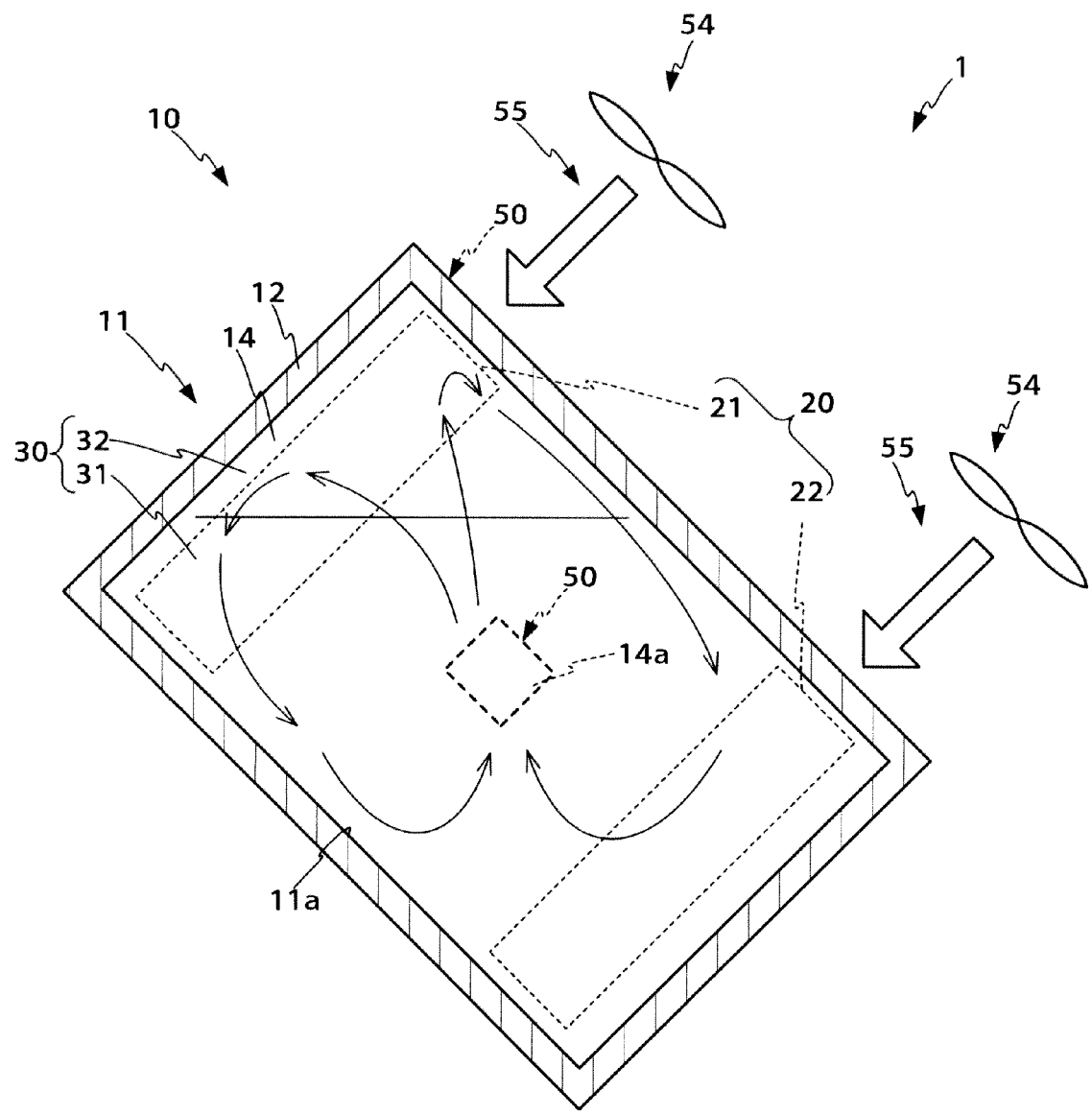
FIG. 6 is a diagram 2 for describing operation of the vapor phase cooling apparatus according to the first embodiment.
Figure 6:
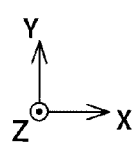
Figure 7:
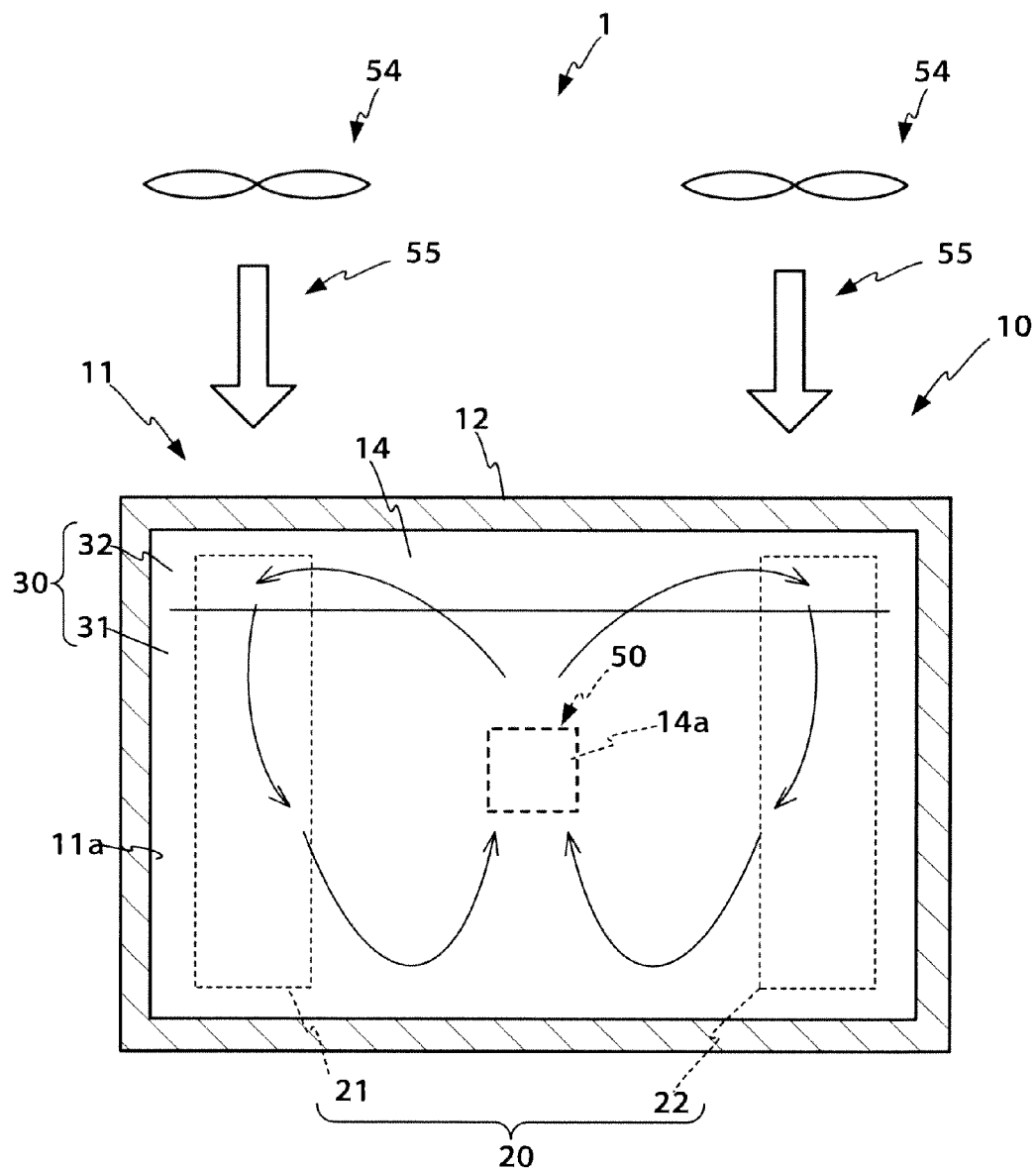
FIG. 7 is a diagram 3 for describing operation of the vapor phase cooling apparatus according to the first embodiment.

Next, with reference to FIGS. 5 to 7, operation of the vapor phase cooling apparatus 10 will be described.

First, a case where the vapor phase cooling apparatus 10 is used in a posture in which the first heat sink 21 is above the electronic component 50 will be described with reference to FIG. 5. When voltage is applied to a circuit including the electronic component 50, power is consumed, causing the electronic component 50 to generate heat. The heat generated in the electronic component 50 is conducted to the liquid refrigerant 31 of the refrigerant 30 through the heat receiver 14a of the heat conductive plate 14. Since the surface of the heat conductive plate 14 in contact with the liquid refrigerant 31 is roughened, a sufficient area to dissipate heat is provided. As a result, heat conducted to the heat conductive plate 14 is efficiently conducted to the liquid refrigerant 31. This heat conduction increases the temperature of the liquid refrigerant 31 around the heat receiver 14a.

Once the temperature of the liquid refrigerant 31 increases to reach boiling point, part of the liquid refrigerant 31 changes its phase (boils) to the vapor refrigerant 32 while taking heat. When the liquid refrigerant changes to the vapor refrigerant, its volume increases hundreds of times and its density decreases. As a result, the vapor refrigerant 32 in the liquid refrigerant 31 moves upward while retaining heat to merge into the vapor refrigerant 32 in the upper portion. Above the heat receiver 14a is disposed the first heat sink 21 of the heat sink unit 20. Then the vapor refrigerant 32 that has moved is deprived of heat by the first heat sink 21 on the heat conductive plate 14. Since the surface of the heat conductive plate 14 is roughened to provide a sufficient area to dissipate heat, heat is efficiently conducted to the first heat sink 21. The vapor refrigerant 32 deprived of heat changes its phase (condenses) to the liquid refrigerant 31 on the heat conductive plate 14. The resulting liquid refrigerant 31 flows down along the surface of the heat conductive plate 14 to merge into the liquid refrigerant 31 in the lower portion.

Meanwhile, heat conducted to the first heat sink 21 is dissipated outside the vapor phase cooling apparatus 10 by the cooling wind 55 supplied by the cooling wind supply unit 54. The above phase change of the refrigerant 30 cools the electronic component 50.

Likewise, where the vapor phase cooling apparatus 10 is disposed in such a way that the second heat sink 22 is above the electronic component 50, the electronic component 50 is cooled by phase change similar to the above.

Next, a case where the vapor phase cooling apparatus 10 is used in a posture tilted by 45 degrees around Z-axis from the posture in FIG. 1 will be described with reference to FIG. 6. In this case, when the electronic component 50 generates heat, the heat is conducted to the liquid refrigerant 31 through the heat receiver 14a of the heat conductive plate 14. This heat conduction increases the temperature of the liquid refrigerant 31.

Once the temperature of the liquid refrigerant 31 increases to reach boiling point, part of the liquid refrigerant 31 changes its phase (boils) to the vapor refrigerant 32 while taking heat. Then, the resulting vapor refrigerant 32 moves upward with the retaining heat. Above the heat receiver 14a is disposed part of the first heat sink 21. Then, the vapor refrigerant 32 that has moved is deprived of heat by the first heat sink 21 on the heat conductive plate 14. The vapor refrigerant 32 deprived of heat changes its phase (condenses) to the liquid refrigerant 31. The resulting liquid refrigerant 31 flows down along the surface of the heat conductive plate 14 to merge into the liquid refrigerant 31 in the lower portion.

Meanwhile, heat conducted to the first heat sink 21 is dissipated outside the vapor phase cooling apparatus 10 by the cooling wind supplied by the cooling wind supply unit 54. The above phase change of the refrigerant 30 cools the electronic component 50.

Next, a case where the vapor phase cooling apparatus 10 is used in a posture of lying in a horizontal direction will be described with reference to FIG. 7. In this case, part of the first heat sink 21 and part of the second heat sink 22 are above the heat receiver 14a. Therefore, the vapor refrigerant 32 that has moved upward is deprived of heat by the first heat sink 21 and second heat sink 22. Then, the vapor refrigerant 32 deprived of heat changes its phase (condenses) into the liquid refrigerant 31. The resulting liquid refrigerant 31 flows down along the surface of the heat conductive plate 14 to merge into the liquid refrigerant 31 in the lower portion. Then, by repeating the phase change of the refrigerant 30, the electronic component 50 is cooled.

As described above, in the vapor phase cooling apparatus 10 according to the first embodiment, the first heat sink 21 and second heat sink 22 are disposed above and below the heat receiver 14a. Accordingly, part of either of the first heat sink 21 and second heat sink 22 is above the heat receiver 14a even if the vapor phase cooling apparatus 10 is tilted around Z axis. Both ends of the first heat sink 21 and both ends of the second heat sink 22 in a horizontal direction are positioned exterior of both ends of the heat receiver 14a in a horizontal direction. Therefore, a part of the first heat sink 21 and second heat sink 22 are above the heat receiver 14a even if the vapor phase cooling apparatus 10 lies in a horizontal direction. As a result, the vapor phase cooling apparatus can provide a cooling effect on the electronic component 50.

Since the surface of the heat conductive plate 14 in contact with the refrigerant 30 is roughened by surface roughening, a sufficient area to dissipate heat is provided, thereby efficiently conducting heat.

In the first embodiment, the refrigerant 30 is enclosed in the internal space 11a by closing the valve of the refrigerant inlet 15. However, any means to enclose the refrigerant 30 can be employed. For example, after filling the refrigerant 30 through the refrigerant inlet 15, the refrigerant inlet 15 may be swaged to enclose the refrigerant 30.

The frame 12, scaling plate 13, and heat conductive plate 14 are separately formed. However, without limitation to this, a frame and a sealing plate may be integrally formed by cutting or the like, or a frame and a heat conductive plate may be integrally formed.

Figure 8:
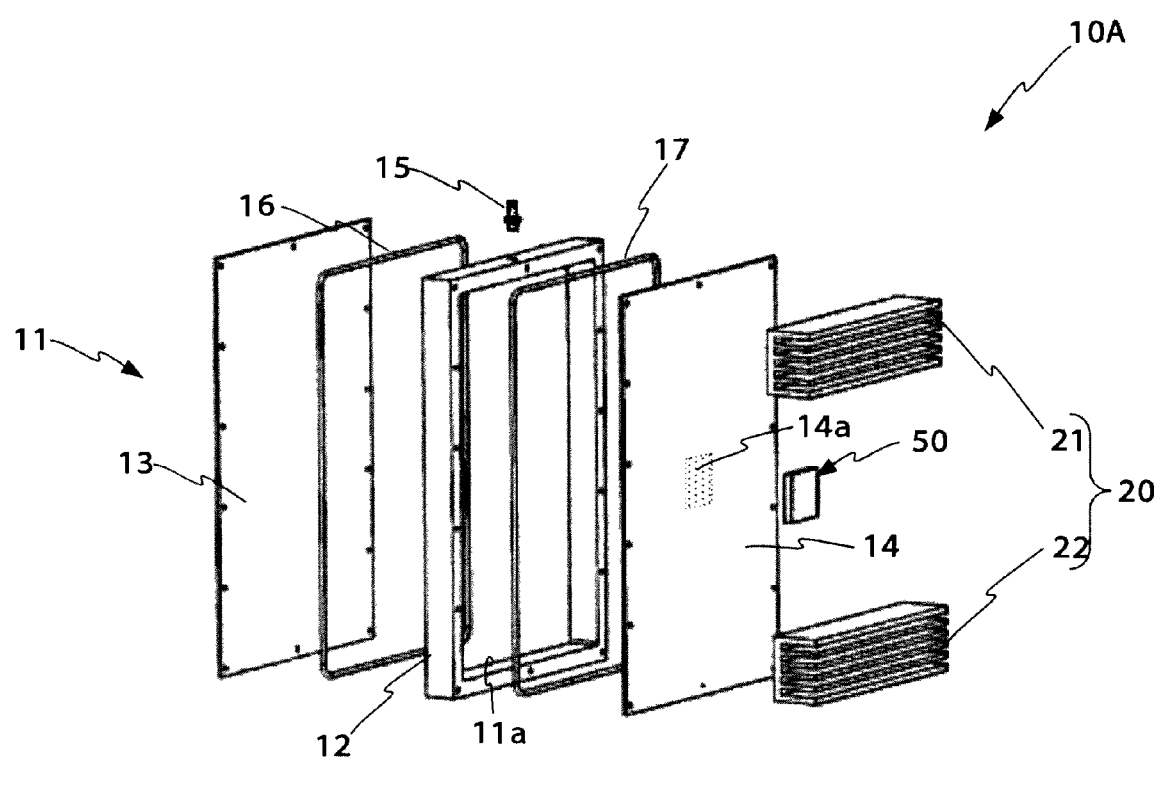
FIG. 8 is an exploded perspective view of a vapor phase cooling apparatus according to variation 1 of the first embodiment.

The sealing plate 13 and heat conductive plate 14 are mounted to the frame 12 by brazing. However, without limitation to this, the sealing plate 13 and heat conductive plate 14 may be mounted to the frame 12 by a screw or the like with O-rings 16, 17, as illustrated in FIG. 8. In this case, since the sealing plate 13 and heat conductive plate 14 can be removed, workability of maintenance and the like can be improved.

Figure 9:
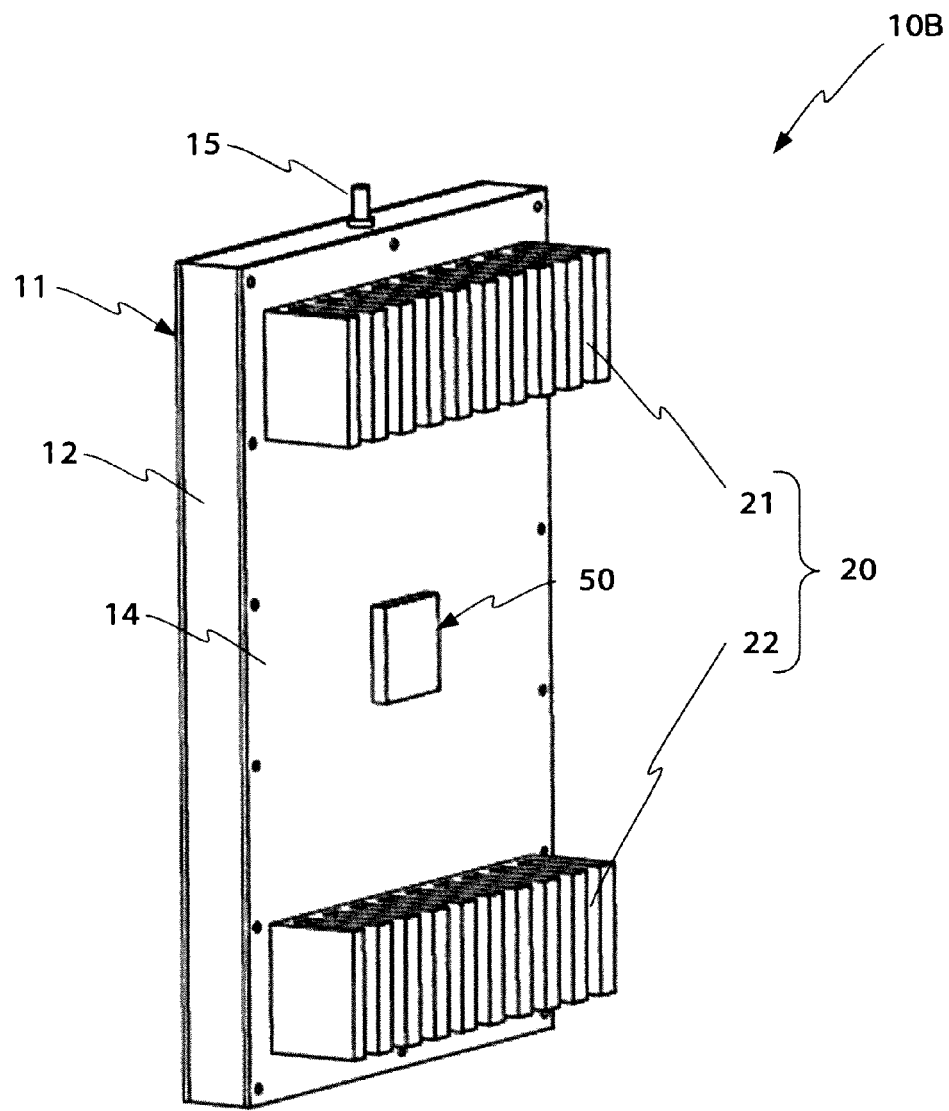
FIG. 9 is a perspective view of a vapor phase cooling apparatus according to variation 2 of the first embodiment.

In the present embodiment, fins of the first heat sink 21 and second heat sink 22 are formed parallel to the X axis, as illustrated in FIG. 1. Without limitation to this, these fins may be formed parallel to the Y axis, as illustrated in FIG. 9.

Figure 10:
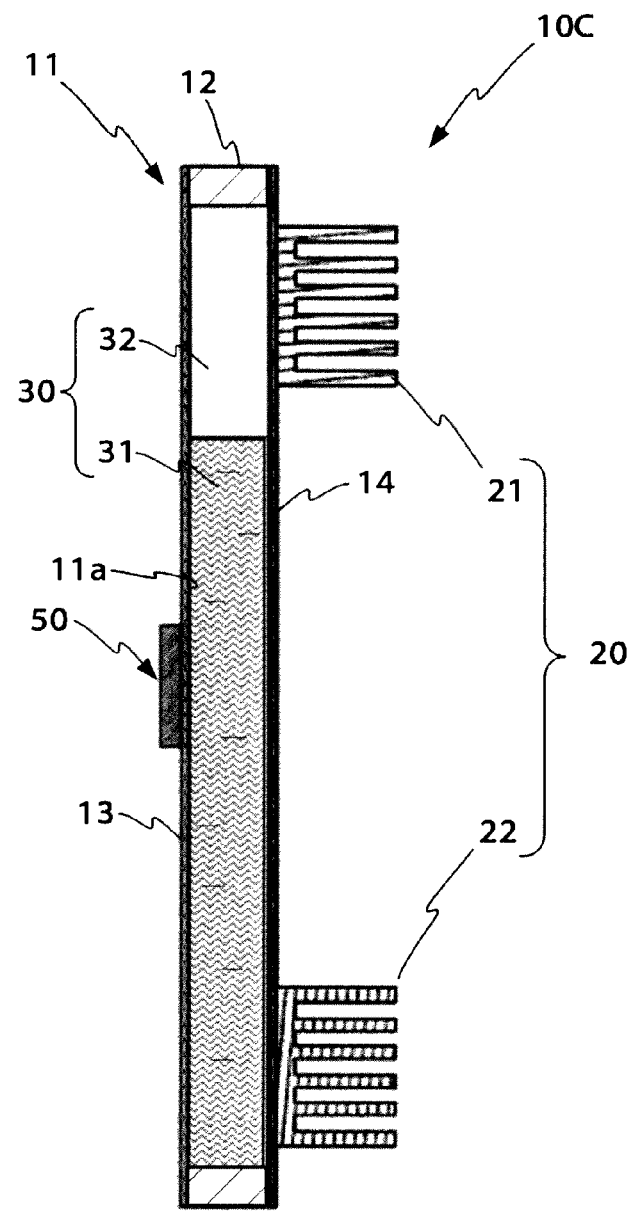
FIG. 10 is a cross-sectional view of vapor phase cooling apparatus according to variation 3 of the first embodiment.

The electronic component 50 is thermally connected to the heat conductive plate 14 on the right side (+Z side) of the housing 11, as illustrated in FIG. 3A. Without limitation to this, the electronic component 50 may be thermally connected to the sealing plate 13 on the left side (−Z side) of the housing 11, as illustrated in FIG. 10.

Second Embodiment

Next, a second embodiment of the present invention will be described with reference to FIGS. 11 and 12. The same reference numerals will be used for the same or equivalent components as those of the first embodiment.

Figure 11:
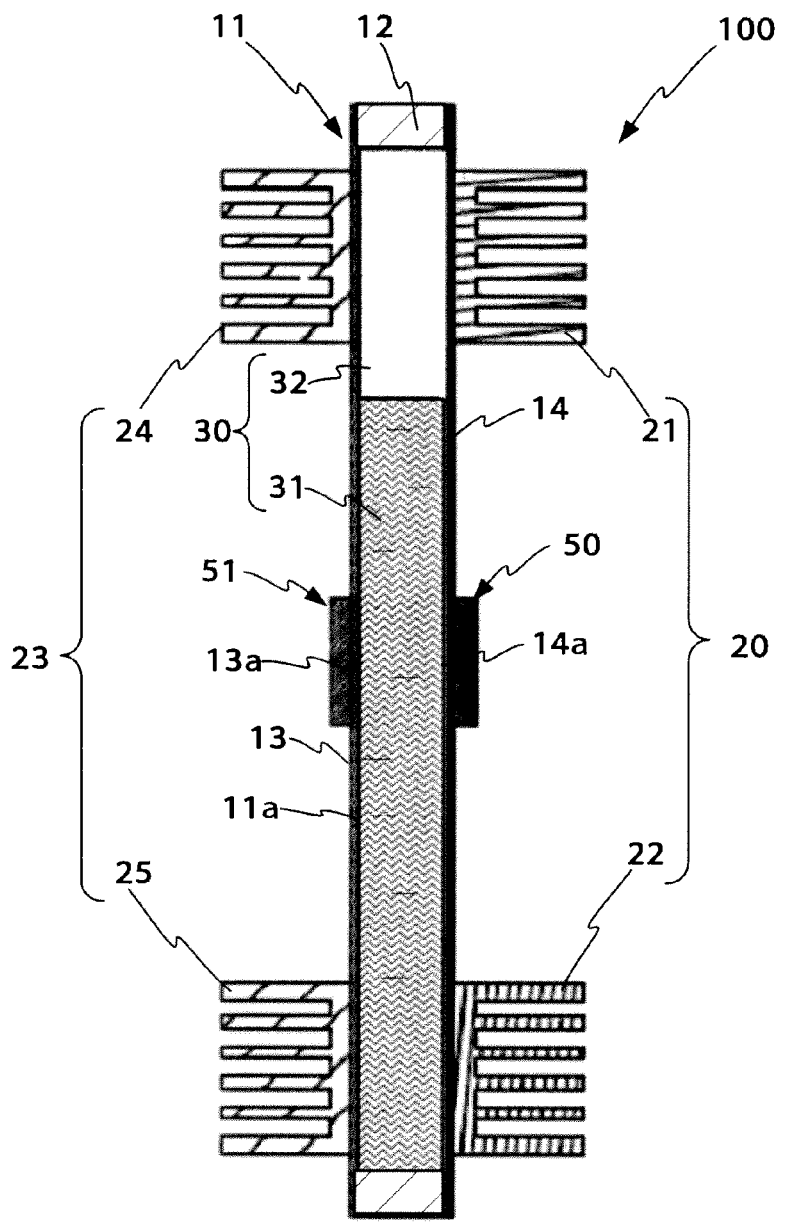
FIG. 11 is a cross-sectional view of a vapor phase cooling apparatus according to a second embodiment of the present invention.
Figure 11:
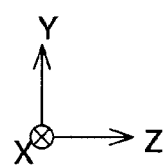
Figure 12:
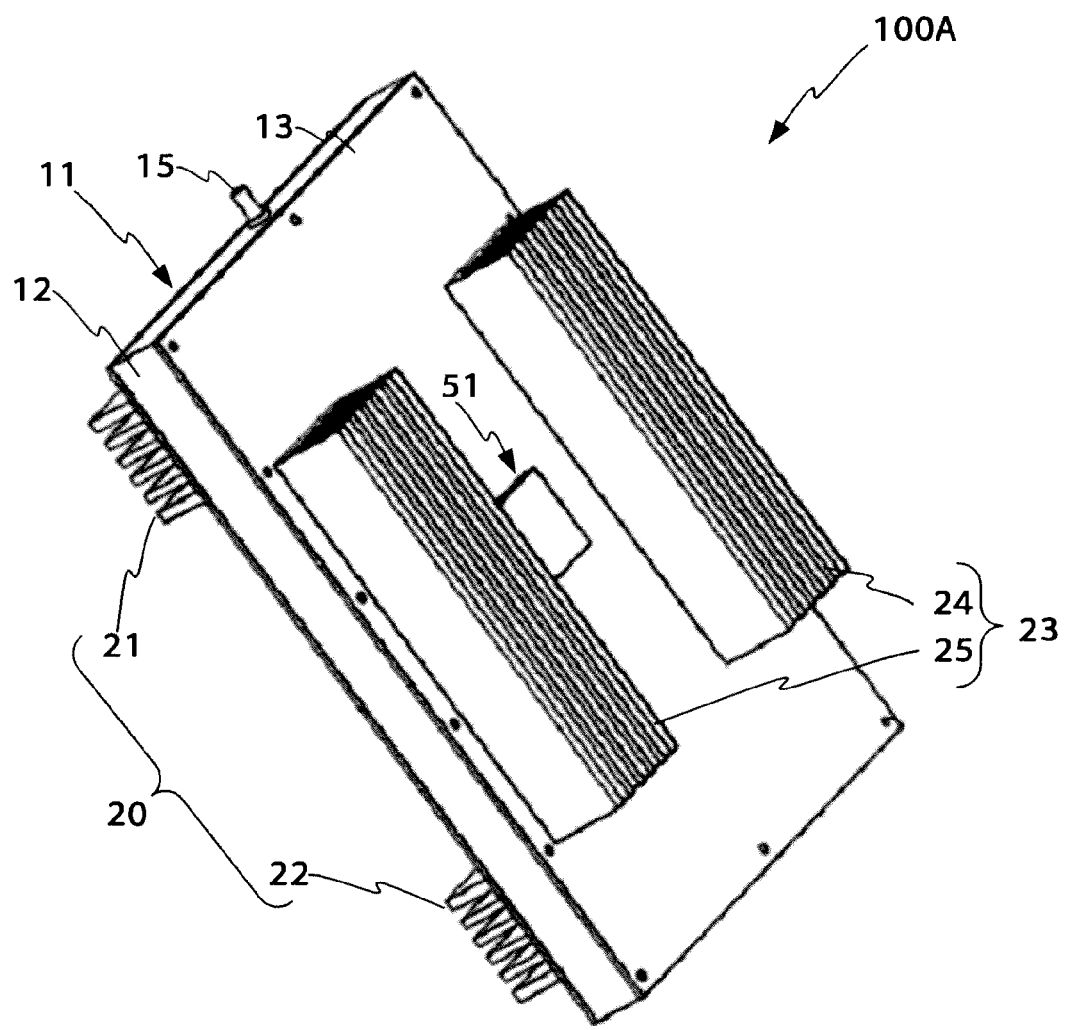
FIG. 12 is a perspective view of a vapor phase cooling apparatus according to a variation of the second embodiment.

A vapor phase cooling apparatus 100 according to the second embodiment further includes a heat sink unit 23 in addition to the heat sink unit 20, as illustrated in FIG. 11. The heat sink unit 23 is fixed onto the sealing plate 13. On the vapor phase cooling apparatus 100 is further disposed an electronic component 51 in addition to the electronic component 50.

The heat sink unit 23 is a member for dissipating heat from the electronic components 50, 51 to the outside, like the heat sink unit 20. The heat sink unit 23 includes a third heat sink 24 fixed on the +Y side and a fourth heat sink 25 fixed on the −Y side. The shape, material and mounting method of the third heat sink 24 and fourth heat sink 25 are the same as those of the first heat sink 21 and second heat sink 22 of the heat sink unit 20.

A surface of the sealing plate 13, of surfaces that define the internal space 11a of the housing 11, was subjected to surface roughening to a predetermined roughness, like the surface of the heat conductive plate 14. The roughness is, for example, 1 μm to 100 μm in arithmetic mean roughness Ra. On the surface of the sealing plate 13, the vicinity of the point at which the electronic component 51 is connected is a heat receiver 13a to receive heat from the electronic component 51.

The above vapor phase cooling apparatus 100 is used, for example, in such a way that the first heat sink 21 and third heat sink 24 are mounted above the electronic components 50, 51, like the vapor phase cooling apparatus 10 according to the first embodiment. A position of the vapor phase cooling apparatus 100 varies depending on the state in which the electronic equipment 1 with the vapor phase cooling apparatus 100 is used: a posture tilted around Z-axis from the posture in FIG. 11 or a posture of lying in a horizontal direction.

Next, operation of the vapor phase cooling apparatus 100 to be used in a posture in which the first heat sink 21 and third heat sink 24 are above the electronic components 50, 51 will be described. When the electronic components 50, 51 generate heat, the heat is conducted to the liquid refrigerant 31 through the heat receivers 14a, 13a of the heat conductive plate 14 and sealing plate 13. Since surfaces of the heat conductive plate 14 and sealing plate 13 in contact with the refrigerant 30 were subjected to surface roughening, the area to dissipate heat is large. Therefore, the heat conductive plate 14 and scaling plate 13 efficiently conduct heat to the liquid refrigerant 31. This heat conduction increases the temperature of the liquid refrigerant 31 around the heat receivers 14a, 13a.

Once the temperature of the liquid refrigerant 31 increases to reach boiling point, part of the liquid refrigerant 31 changes its phase (boils) to the vapor refrigerant 32 while taking heat. When the liquid refrigerant changes its phase to the vapor refrigerant, its volume increases millions of times and its density decreases. Therefore, the vapor refrigerant 32 in the liquid refrigerant 31 moves upward while retaining heat to merge into the vapor refrigerant 32 in the upper portion. Above the heat receivers 14a, 13a are disposed the first heat sink 21 of the heat sink unit 20 and the third heat sink 24 of the heat sink unit 23. Then, the vapor refrigerant 32 that has moved is derived of heat by the first heat sink 21 and third heat sink 24. Since surfaces of the heat conductive plate 14 and sealing plate 13 in contact with the refrigerant 30 were subjected to surface roughening, the area to dissipate heat is large. Accordingly, the heat conductive plate 14 and sealing plate 13 efficiently conduct heat to the first heat sink 21 and third heat sink 24. The vapor refrigerant 32 derived of heat changes its phase (condenses) into the liquid refrigerant 31 on the heat conductive plate 14 and sealing plate 13. The resulting liquid refrigerant 31 flows down along the surfaces of the heat conductive plate 14 and sealing plate 13 to merge into the liquid refrigerant 31 in the lower portion.

Meanwhile, heat conducted to the first heat sink 21 and third heat sink 24 is dissipated outside the vapor phase cooling apparatus 100 by the cooling wind 55 supplied by the cooling wind supply unit 54, like in the first embodiment. By the above phase change of the refrigerant 30, the vapor phase cooling apparatus 100 cools the electronic components 50, 51.

In the above vapor phase cooling apparatus 100, at least a part of any one of the first to fourth heat sinks 21, 22, 24, 25 is above the heat receivers 14a, 13a even if its posture is tilted around Z axis from the posture in FIG. 11, like the vapor phase cooling apparatus 10 according to the first embodiment; and at least a part of all of the first to fourth heat sinks 21, 22, 24, 25 is above the heat receivers 14a even if the vapor phase cooling apparatus 100 lies in a horizontal direction. Accordingly, by the phase change of the refrigerant 30, the vapor phase cooling apparatus 100 can cool the electronic components 50, 51.

As described above, the vapor phase cooling apparatus 100 according to the second embodiment includes the two heat sink units 20, 23, and therefore has an increased cooling effect for cooling an electronic component whose heat generation amount is large or for simultaneously cooling several electronic components.

The heat sink units 20, 23 are fixed to opposite sides of the housing 11, respectively. Accordingly, part of any of the first to fourth heat sinks 21, 22, 24, 25 is above the electronic components 50, 51 even if the vapor phase cooling apparatus 10 is tilted around any of Z axis, X axis and Y axis from the posture in FIG. 11. As a result, the resultant (boiling) vapor refrigerant 32 moves to the vicinity of either of the heat sink units 20, 23, and can cool the electronic components 50, 51 by the phase change.

In the second embodiment, the two electronic components 50, 51 are disposed. Without limitation to this, one electronic component or more than two electronic components may be disposed.

In the second embodiment, the first heat sink 21 and third heat sink 24 both are disposed on the +Y side from the heat receivers 14a, 13a, and the second heat sink 22 and fourth heat sink 25 both are disposed on the −Y side from the heat receivers 14a, 13a. That is, the direction in which the third heat sink 24 and fourth heat sink 25 face each other is the same as that (Y direction) in which the first heat sink 21 and second heat sink 22 face each other. However, without limitation to this, as illustrated in FIG. 12, the direction in which the third heat sink 24 and fourth heat sink 25 face each other may be orthogonal to the direction in which the first heat sink 21 and second heat sink 22 face each other.

In this case, fins of the first heat sink 21 and second heat sink 22 of the heat sink unit 20 maybe formed parallel to the X axis and fins of the third heat sink 24 and fourth heat sink 25 of the heat sink unit 23 may be formed parallel to the Y axis so that directions of both of the fins are orthogonal to each other.

Third Embodiment

Next, a third embodiment of the present invention will be described with reference to FIG. 13. The same reference numerals will be used for the same or equivalent components as those of the first and second embodiments.

Figure 13:
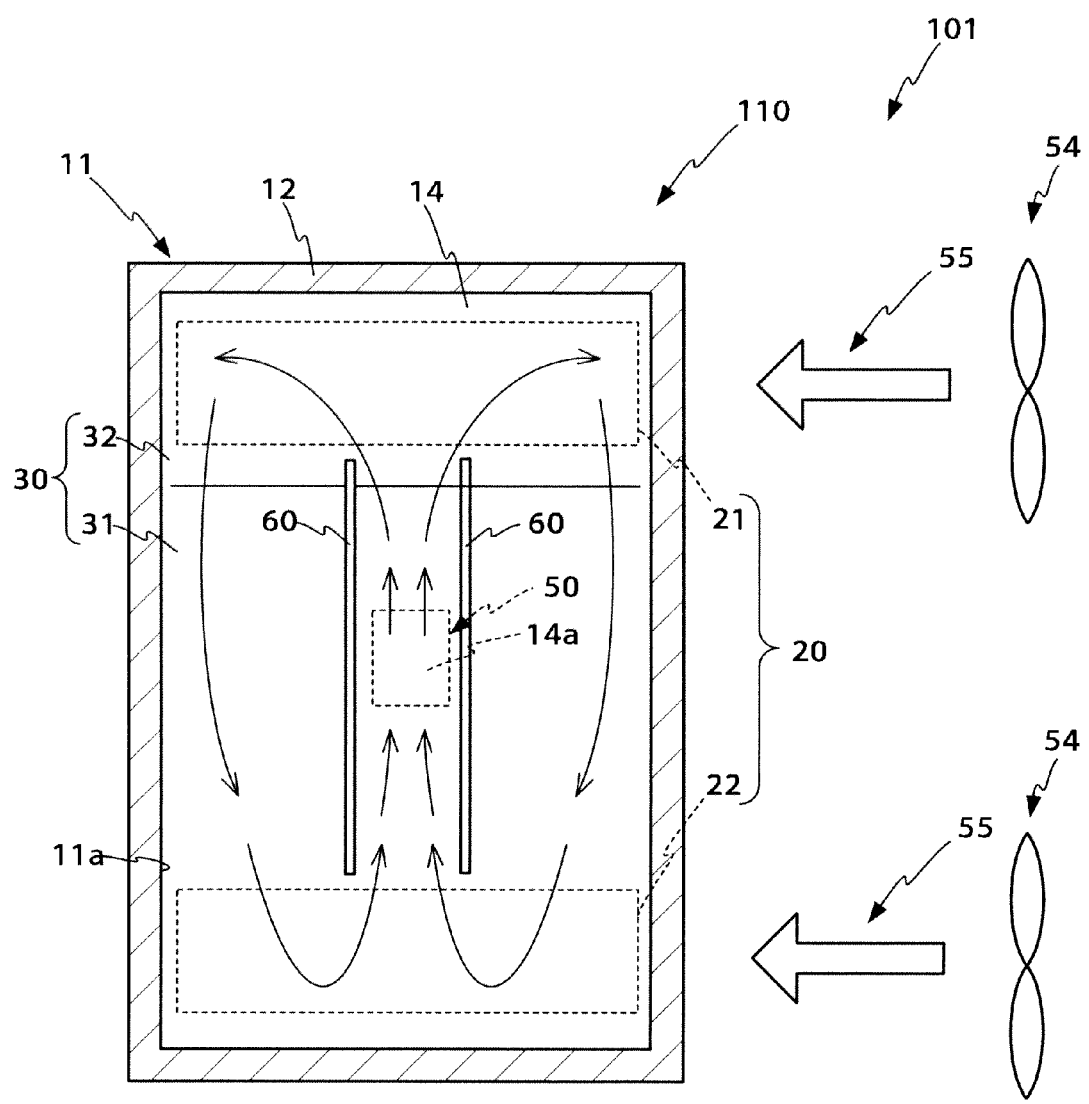
FIG. 13 is a cross-sectional view of a vapor phase cooling apparatus according to a third embodiment of the present invention.

In a vapor phase cooling apparatus 110 according to the third embodiment, in the internal space 11a of the housing 11 are formed dividers 60 to define a flow path for the boiling refrigerant 30, as illustrated in FIG. 13. These dividers 60 guide the refrigerant 30 that has boiled by receiving heat to the first heat sink 21 or second heat sink 22 thereby to increase cooling and rectifying effects.

The dividers 60 are formed by projecting part of the heat conductive plate 14 on which the electronic component 50 is mounted, and are formed parallel to the direction in which the first heat sink 21 and second heat sink 22 face each other (Y direction). The dividers 60 are formed on both sides of the heat receiver 14a. The distance between the dividers 60 is, for example, once to twice as long as the length in X axis direction of the electronic component 50 since the distance that is too short causes a large pressure loss and the distance that is too long causes a low rectifying effect.

Next, operation of the vapor phase cooling apparatus 110 will be described where the vapor phase cooling apparatus 110 is used in a posture in which the first heat sink 21 is above the electronic component 50 mounted to an electronic equipment 101. When the electronic component 50 generates heat, the heat is conducted to the liquid refrigerant 31 through the heat receiver 14a of the heat conductive plate 14. This heat conduction increases the temperature of the liquid refrigerant 31 of the refrigerant 30. Once the temperature of the liquid refrigerant 31 increases to reach boiling point, part of the liquid refrigerant 31 changes its phase (boils) to the vapor refrigerant 32 while taking heat. Then the resulting vapor refrigerant 32 moves upward between the dividers 60 while retaining heat. Above the heat receiver 14a is disposed the first heat sink 21, which deprives the vapor refrigerant 32 that has moved of heat. The vapor refrigerant 32 deprived of heat changes its phase (condenses) to the liquid refrigerant 31. The resulting liquid refrigerant 31 flows down the heat conductive plate 14 outside the dividers 60 to merge into the liquid refrigerant 31 in the lower portion. By repeating the above phase change of the refrigerant 30, the electronic component 50 is cooled.

Even if the above vapor phase cooling apparatus 110 is tilted around Z axis from the posture in FIG. 13 or lies in a horizontal direction, part of either of the first heat sink 21 and the second heat sink 22 is above the heat receiver 14a, like in the first and second embodiments, thereby cooling the electronic component 50.

As described above, in the internal space of the housing 11 of the vapor phase cooling apparatus 110 according to the third embodiment are formed the dividers 60. Therefore, the vapor refrigerant 32 boiling around the heat receiver 14a moves upward between the dividers 60. These dividers 60 divide a flow path for the vapor refrigerant 32 boiling around the heat receiver 14a from a flow path for the liquid refrigerant 31 condensing around the heat sink unit 20, thereby increasing the rectifying effect.

In the third embodiment, the dividers 60 are formed on the heat conductive plate 14. Without limitation to this, the dividers 60 may be formed on the sealing plate 13. The dividers 60 are formed by projecting part of the heat conductive plate 14. Without limitation to this, the dividers 60 may be formed separately from the heat conductive plate 14. In this case, the dividers can be fixed to the heat conductive plate 14 or the sealing plate 13 by a fixing method such as brazing.

The dividers 60 are part of the heat conductive plate 14 and are made of a material having a high heat conductivity, such as copper and aluminum. Alternatively, the dividers 60 may be formed separately from the heat conductive plate 14 and be made of a material having a lower heat conductivity than that of the heat conductive plate 14. In this case, heat exchange between the flow paths divided by the dividers 60 becomes more difficult, thereby further increasing the rectifying effect.

Fourth Embodiment

Next, a fourth embodiment of the present invention will be described with reference to FIG. 14. The same reference numerals will be used for the same or equivalent components as those of the first to third embodiments.

Figure 14:
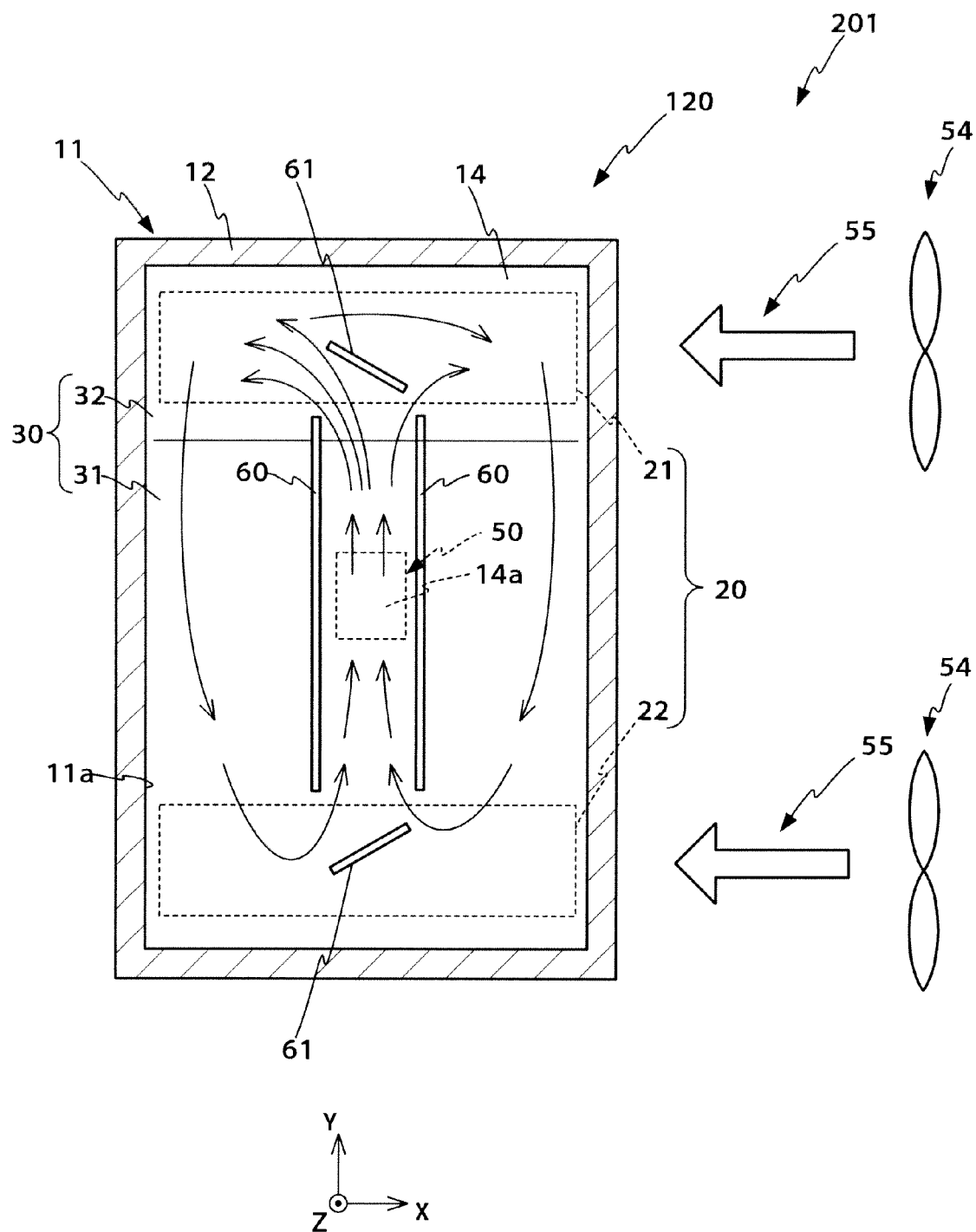
FIG. 14 is a cross-sectional view of a vapor phase cooling apparatus according to a fourth embodiment of the present invention.

A vapor phase cooling apparatus 120 according to the fourth embodiment includes dividers 61 tilted relative to Y direction in addition to the dividers 60 as illustrated in FIG. 14.

To the heat sink unit 20 of the vapor phase cooling apparatus 120, the cooling wind 55 is supplied in −X direction from the cooling wind supply unit 54. Since the cooling wind 55 is supplied in −X direction, the temperature at the end of the windward side (+X direction) of the heat sink unit 20 is the lowest in the heat sink unit 20. The inventor confirmed by experiment that the temperature at the end of the windward side of the heat sink unit 20 was the lowest, and also confirmed that this temperature drop reduces the pressure of the vapor refrigerant 32, facilitating the vapor refrigerant 32 flowing toward the windward side of the heat sink unit 20. The vapor phase cooling apparatus 120 according to the fourth embodiment includes the dividers 61 for guiding the boiling vapor refrigerant 32 to the leeward side (−X side), on the basis of the result of the experiment.

The dividers 61 are formed by projecting part of the heat conductive plate 14 on which the electronic component 50 is mounted, like the dividers 60. The dividers 61 are formed on the +Y side and −Y side from the dividers 60.

Next, operation of the vapor phase cooling apparatus 120 will be described where the vapor phase cooling apparatus 120 is used in a posture in which the first heat sink 21 is above the electronic component 50 mounted to an electronic equipment 201. When the electronic component 50 generates heat, the heat is conducted to the liquid refrigerant 31 through the heat receiver 14a of the heat conductive plate 14. This heat conduction increases the temperature of the liquid refrigerant 31. Once the temperature of the liquid refrigerant 31 increases to reach boiling point, part of the liquid refrigerant 31 changes its phase (boils) to the vapor refrigerant 32 while taking heat. The resulting vapor refrigerant 32 moves upward by being guided by the dividers 60 while retaining heat. Then, the vapor refrigerant 32 that has moved to the upper portion by being guided by the dividers 60 further moves along an upper one of the dividers 61 to be guided to the leeward side (−X side) of the cooling wind.

Since above the heat receiver 14a is disposed the first heat sink 21, the vapor refrigerant 32 that has moved is deprived of heat by the first heat sink 21. The vapor refrigerant 32 deprived of heat changes its phase (condenses) to the liquid refrigerant 31. The resulting liquid refrigerant 31 flows along the surface of the heat conductive plate 14 to merge into the liquid refrigerant 31. By repeating the above phase change of the refrigerant 30, the electronic component 50 is cooled.

Even if the above vapor phase cooling apparatus 120 is tilted around Z axis from the posture in FIG. 14 or lies in a horizontal direction, part of either of the first heat sink 21 and second heat sink 22 is above the heat receiver 14a, like the first to third embodiments, thereby cooling the electronic component 50.

As described above, in the internal space 11a of the housing 11 of the vapor phase cooling apparatus 120 according to the fourth embodiment are formed the dividers 61 tilted relative to the supply direction of the cooling wind 55 for guiding the vapor refrigerant 32 that has boiled to the leeward side. This can prevent the vapor refrigerant 32 that has boiled from heavily flowing to the vicinity of the windward side of the heat sink unit 20, which increases its cooling effect.

in the fourth embodiment, the dividers 61 are formed on the heat conductive plate 14. Without limitation to this, the dividers 61 may be formed on the sealing plate 13. The dividers 61 are formed by projecting part of the heat conductive plate 14. Without limitation to this, the dividers 61 may be formed separately f the heat conductive plate 14. In this case, the dividers 61 can be fixed to the heat conductive plate 14 or the sealing plate 13 by a fixing method such as brazing.

The dividers 61 are part of the heat conductive plate 14 and made of a material having a high heat conductivity, such as copper and aluminum. Alternatively, the dividers 61 may be formed separately from the heat conductive plate 14 and made of a material having a lower heat conductivity than that of the heat conductive plate 14.

Fifth Embodiment

Next, a fifth embodiment of the present invention will be described with reference to FIGS. 15 and 16. The same reference numerals will be used for the same or equivalent components as those of the first to fourth embodiments.

Figure 15:
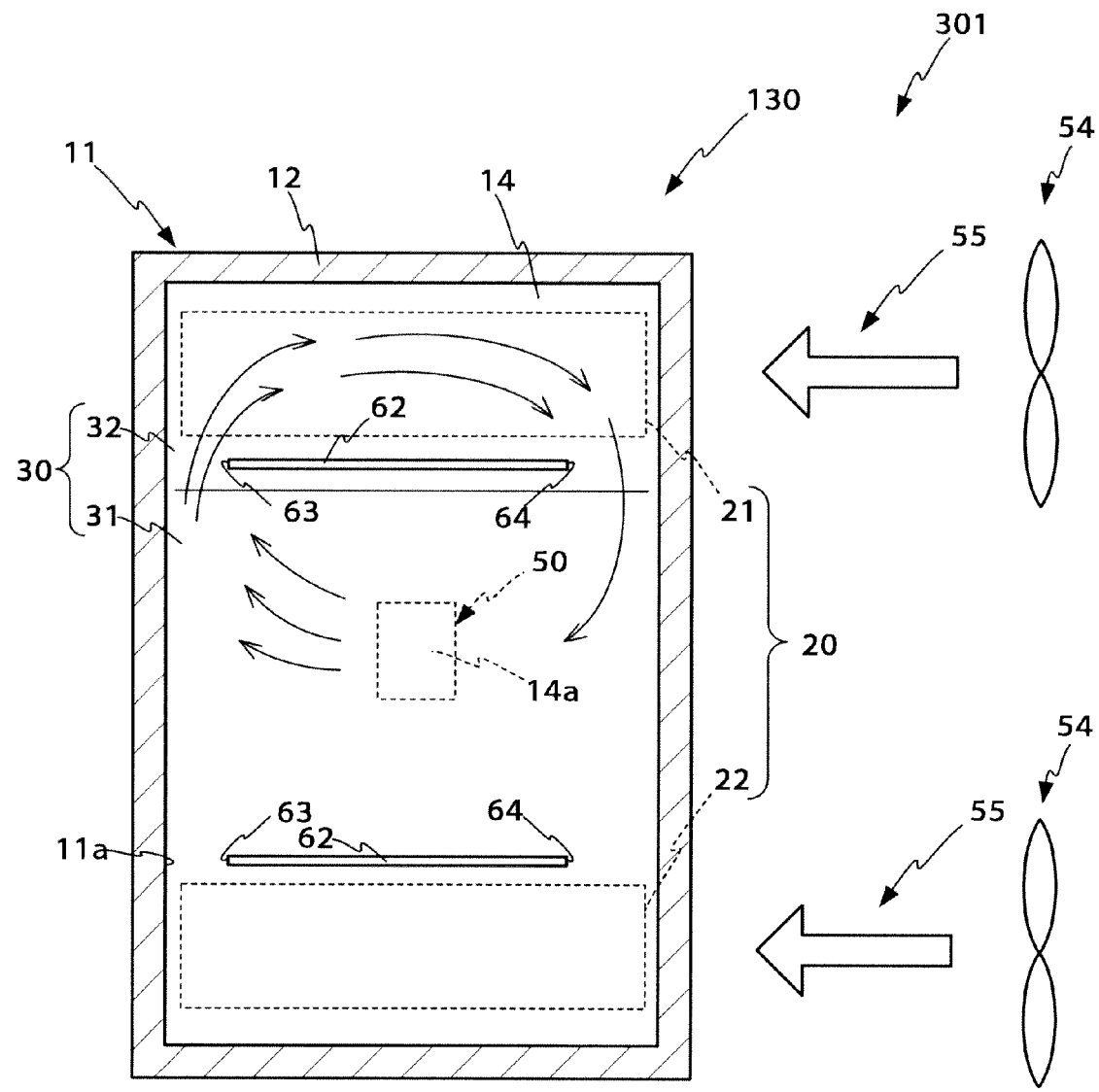
FIG. 15 is a cross-sectional view of a vapor phase cooling apparatus according to a fifth embodiment of the present invention.
Figure 16:
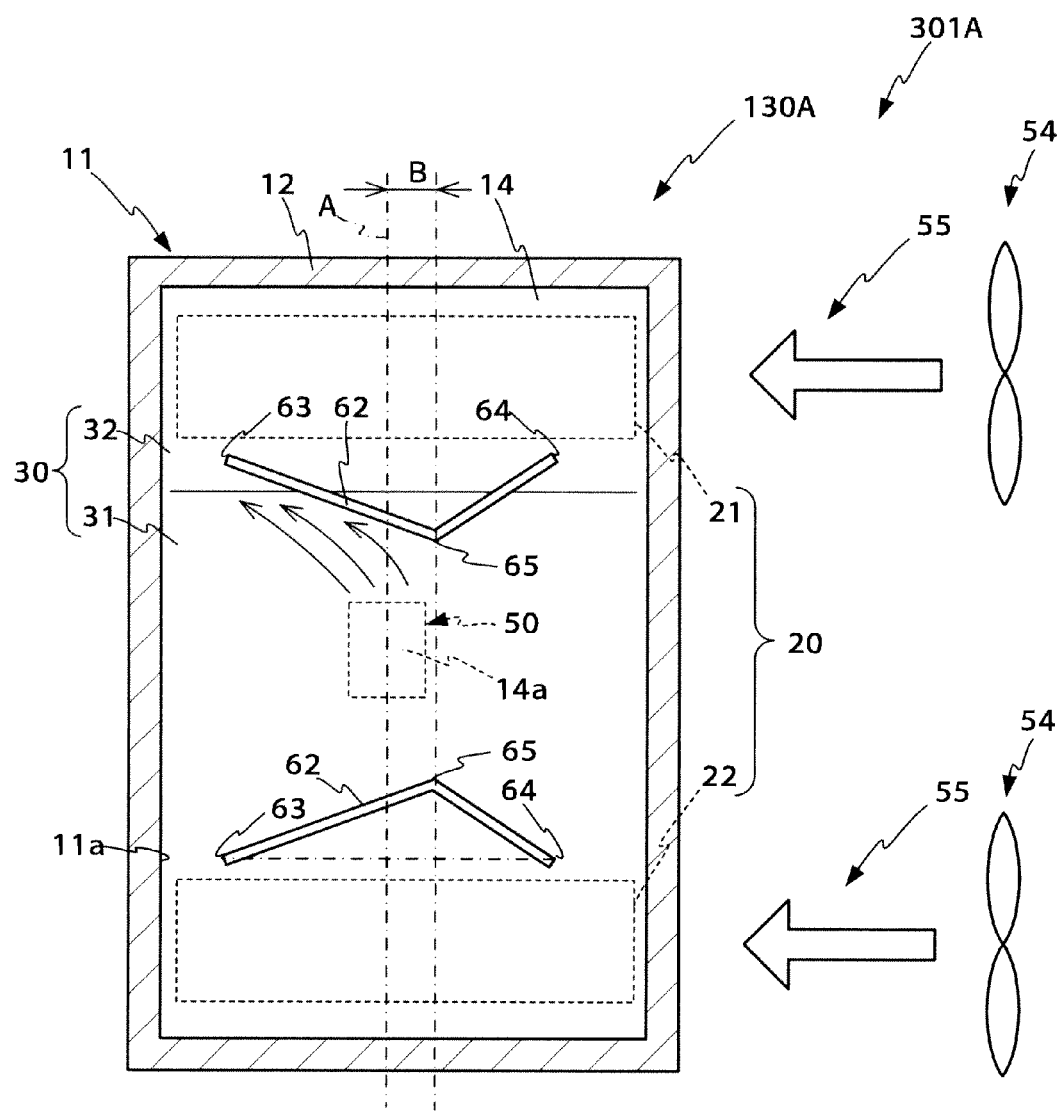
FIG. 16 is a cross-sectional view of a vapor phase cooling apparatus according to a variation of the fifth embodiment.

In the internal space 11a of the housing 11 of a vapor phase cooling apparatus 130 according to the fifth embodiment are formed dividers 62 parallel to the X direction, as illustrated in FIG. 15. The dividers 62 are formed by projecting part of the heat conductive plate 14 on which the electronic component 50 is mounted and are formed on the +Y side and −Y side from the heat receiver 14a. For guiding the boiling vapor refrigerant 32 to the vicinity of the first heat sink 21, flow inlets 63, which is the space between the ends of the −X side of the dividers 62 (the leeward side of the cooling wind 55) and the frame 12, are formed. For guiding the liquid refrigerant 31 condensed by the first heat sink 21 to the vicinity of the heat receiver 14a, flow outlets 64, which is the space between the ends of the +X side of the dividers 62 (the windward side of the cooling wind 55) and the frame 12, are formed. Each of the flow inlets 63 is formed so that its opening area is larger than that of each of the flow outlets 64.

Next, operation of the vapor phase cooling apparatus 130 will be described where the vapor phase cooling apparatus 130 is used in a posture in which the first heat sink 21 is above the electronic component 50 mounted on an electronic equipment 301. In this vapor phase cooling apparatus 130, when the electronic component 50 generates heat, the heat is conducted to the liquid refrigerant 31 through the heat receiver 14a of the heat conductive plate 14. This heat conduction increases the temperature of the liquid refrigerant 31. Once the temperature of the liquid refrigerant 31 increases to reach boiling point, part of the liquid refrigerant 31 changes its phase (boils) to the vapor refrigerant 32 while taking heat. Then, the resulting vapor refrigerant 32 moves upward through the flow inlet 63 while retaining heat.

The vapor refrigerant 32 that has moved to the upper portion moves rightward to the windward side while being deprived of heat by the first heat sink 21. The vapor refrigerant 32 deprived of heat changes its phase (condenses) to the liquid refrigerant 31. The resulting liquid refrigerant 31 moves downward through one of the flow outlets 64 to merge into the liquid refrigerant 31 in the lower portion. By repeating the above phase change of the refrigerant 30, the electronic component 50 is cooled.

Even if the above vapor phase cooling apparatus 130 is tilted around Z axis from the posture in FIG. 15 or lies in a horizontal direction, part of either of the first heat sink 21 and second heat sink 22 is above the heat receiver 14a, like the first to fourth embodiments, thereby cooling the electronic component 50.

As described above, in the internal space 11a of the housing 11 of the vapor phase cooling apparatus 130 according to the fifth embodiment are formed the dividers 62 that are parallel to the X direction, and also space is provided between both ends of the dividers 62 and the frame 12 to form the flow inlets 63 on the left side and the flow outlets 64 on the right side. This enables the vapor refrigerant 32 that entered through the flow inlet 63 to flow from the leeward side to the windward side of the cooling wind 55, as a result, increasing the cooling effect.

Each of the flow inlets 63 is formed so that its opening area is larger than that of each of the flow outlets 64. This facilitates guiding the vapor refrigerant 32 that has changed its phase (has boiled) upward through the flow inlet 63, thereby increasing the rectifying effect of the refrigerant 30.

In the fifth embodiment, the dividers 62 are formed on the heat conductive plate 14. Without limitation to this, the dividers 62 may be formed on the sealing plate 13. In the fifth embodiment, the dividers 62 are formed by projecting part of the heat conductive plate 14. Without limitation to this, the dividers 62 may be formed separately from the heat conductive plate 14. In this case, the dividers can be fixed to the heat conductive plate 14 or the sealing plate 13 by a fixing method such as brazing.

The dividers 62 are part of the heat conductive plate 14 and made of a material having a high heat conductivity, such as copper and aluminum. Alternatively, the dividers 62 may be formed separately from the heat conductive plate 14 and made of a material having a lower heat conductivity than that of the heat conductive plate 14.

The dividers 62 are horizontally formed. Without limitation to this, the dividers 62 may have approximately V-shaped cross-sections, as illustrated in FIG. 16. Corners 65 of the dividers 62 that correspond to vertexes of the approximate V-shape may be shifted from center A in X direction of the dividers 62 to the windward direction (+X direction) by a predetermined length (length B). This enables a larger volume of the vapor refrigerant 32 to be guided along a line of the −X side from the corner 65 of one of the dividers 62 to one of the flow inlet 63.

Sixth Embodiment

Next, a sixth embodiment of the present invention will be described with reference to FIGS. 17 and 18. The same reference numerals will be used for the same or equivalent components as those of the first to fifth embodiments.

Figure 17:
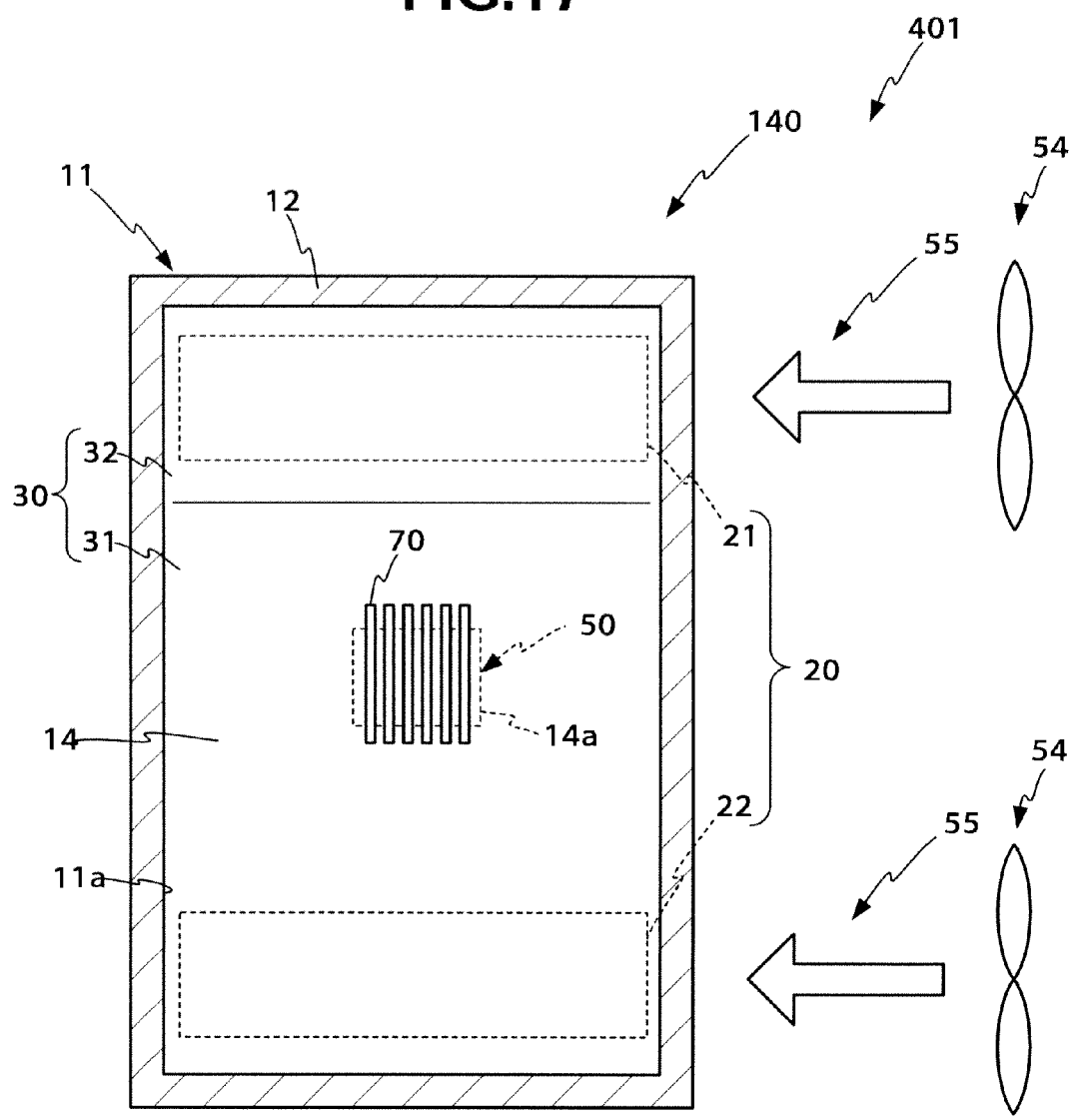
FIG. 17 is a cross-sectional view of a vapor phase cooling apparatus according to a sixth embodiment of the present invention.
Figure 18:
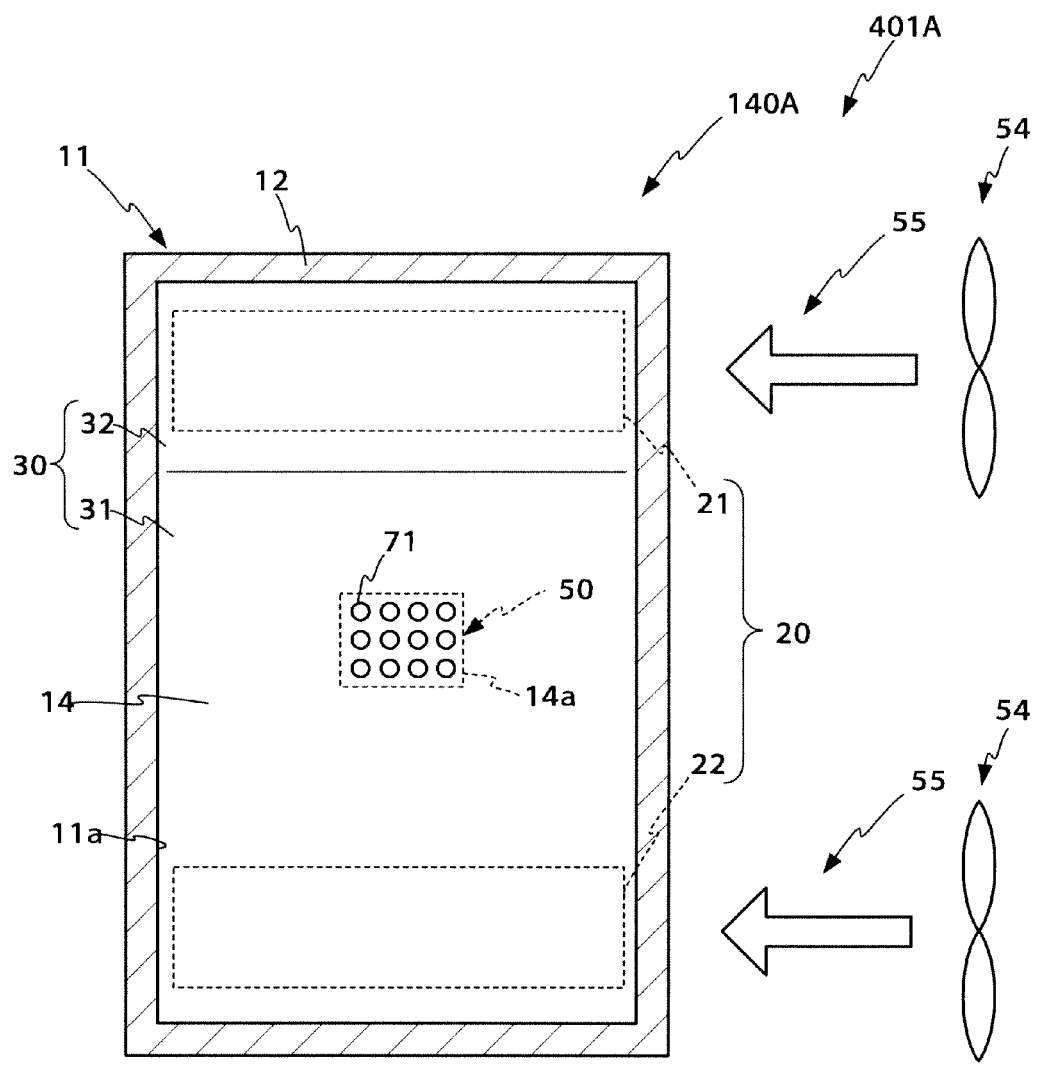
FIG. 18 is a cross-sectional view of a vapor phase cooling apparatus according to a variation of the sixth embodiment.

In the internal space 11a of the housing 11 of a vapor phase cooling apparatus 140 according to the sixth embodiment is formed an internal heat sink 70 composed of fins that project into the internal space 11a, as illustrated in FIG. 17. Each of the tins of the internal heat sink 70 is formed parallel to the Y axis. The internal heat sink 70 is thermally connected to the heat receiver 14a. This internal heat sink 70 has a sufficient area to dissipate heat, facilitating conducting heat from the electronic component 50 to the liquid refrigerant 31.

In the present embodiment, the internal heat sink 70 is composed of fins. Without limitation to this, an internal heat sink may be composed of pins projecting into the internal space 11a as illustrated in FIG. 18. In this case, similarly, an internal heat sink 71 composed of pins has a sufficient area to dissipate heat, facilitating conducting heat from the electronic component 50 to the liquid refrigerant 31.

In the present invention, various embodiments and variations are possible without departing from the broad spirit and scope of the present invention. The above embodiments are for describing the present invention, not for limiting the scope of the present invention.

Part or all of the above embodiments can be described as in the supplementary notes below but they are not limited to these.

(Supplementary note 1)

A vapor phase cooling apparatus including:

a housing including a heat receiver configured to receive heat from an electronic component that is a heat source, the electric component being connected to a first surface that is a vertical outer surface of the housing, the housing having an internal space for enclosing refrigerant; and a first heat sink and a second heat sink that are disposed above and below the heat receiver, respectively, the first and second heat sinks dissipating the heat to the outside;

both ends of the first heat sink and both ends of the second heat sink in a horizontal direction are positioned exterior of both ends of the heat receiver in a horizontal direction.

(Supplementary note 2)

The vapor phase cooling apparatus according to supplementary note 1, wherein the housing has an approximately rectangular shape, and the first and second heat sinks are disposed on the first surface.

(Supplementary note 3)

The vapor phase cooling apparatus according to supplementary note 2, further including a third heat sink and a fourth heat sink that are disposed on a second surface, the second surface being an outer surface of the housing and opposite to the first surface, the third and fourth heat sink dissipating the heat to the outside.

(Supplementary note 4)

The vapor phase cooling apparatus according to supplementary note 3, wherein the direction in which the first heat sink and the second heat sink face each other is orthogonal to the direction in which the third heat sink and the fourth heat sink face each other.

(Supplementary note 5)

The vapor phase cooling apparatus according to any one of supplementary note 1 to 4, wherein the surface defining the internal space is subjected to surface roughening.

(Supplementary note 6)

The vapor phase cooling apparatus according to any one of supplementary notes 1 to 5, further including a first divider that is formed on a surface defining the internal space and in a direction parallel to the direction in which the first heat sink and the second heat sink face each other, the first divider guiding the refrigerant that has boiled due to the heat to a vicinity of the first heat sink or the second heat sink.

(Supplementary note 7)

The vapor phase cooling apparatus according to supplementary note 6, wherein cooling wind is supplied in a predetermined direction to the first heat sink and the second heat sink, the vapor phase cooling apparatus further including a second divider on a surface defining the internal space, the second divider being tilted relative to the supply direction of the cooling wind, the second divider further guiding the refrigerant guided by the first divider in a leeward direction of the cooling wind.

(Supplementary note 8) The vapor phase cooling apparatus according to any one of supplementary notes 1 to 5, wherein cooling wind is supplied in a predetermined direction to the first heat sink and the second heat sink, the vapor phase cooling apparatus further including a third divider on a surface defining the internal space, the third divider being formed parallel to the supply direction of the cooling wind.

ends of windward side and leeward side of the third divider having openings formed, the area of the opening at the leeward side being larger than the area of the opening at, the windward side.

(Supplementary note 9)

The vapor phase cooling apparatus according to any one of supplementary notes 1 to 5 including a fifth heat sink on a surface defining the internal space, the fifth heat sink conducting heat from the heat receiver to the refrigerant.

(Supplementary note 10)

An electronic equipment including:

an electronic component that becomes a heat source by consuming power;

a vapor phase cooling apparatus according to any one of supplementary notes 1 to 9 in which the electronic component and the heat receiver are thermally connected; and a cooling wind supply unit configured to supply cooling wind to a first heat sink and a second heat sink of the vapor phase cooling apparatus.

(Supplementary note 11)

The vapor phase cooling apparatus according to supplementary note 8, wherein the third divider is approximately V-shaped having one corner.

(Supplementary note 12) The vapor phase cooling apparatus according to supplementary note 11, wherein the corner is located at windward side rather than the center of the surface on which the third divider is disposed.

INDUSTRIAL APPLICABILITY

A vapor phase cooling apparatus and an electronic equipment according to the present invention are suitable for cooling a heated electronic component.

DESCRIPTION OF REFERENCE NUMERALS 1, 101, 201, 301, 301A, 401, 401A Electronic equipment
10, 10A, 10B, 10C 100, 100A, 110, 120, 130, 130A, 140, 140A Vapor phase cooling apparatus
11 Housing
11a Internal space
12 Frame
13 Sealing plate
13a, 14a Heat receiver
14 Heat conductive plate
15 Refrigerant inlet
16, 17 O ring
20, 23 Heat sink unit
21 First heat sink
22 Second heat sink
24 Third heat sink
25 Fourth heat sink
30 Refrigerant
31 Liquid refrigerant
32 Vapor refrigerant
50, 51 Electronic component
54 Cooling wind supply unit
55 Cooling wind
60, 61, 62 Divider (first divider, second divider, third divider)
63 Flow inlet (opening)
64 Flow outlet (opening)
70, 71 Internal heat sink (fifth heat sink)

The invention claimed is:

1. A vapor phase cooling apparatus comprising:
a rectangular parallelepiped-shaped housing comprising a heat receiver configured to receive heat generated by an electronic component that is a heat source, the electronic component being connected to a first surface that is a vertical outer surface of the rectangular parallelepiped-shaped housing, the rectangular parallelepiped-shaped housing having an internal space for enclosing refrigerant; and
a first heat sink and a second heat sink that are disposed above and below the heat receiver, respectively, the first and second heat sinks dissipating the heat to the outside,
wherein both ends of the first heat sink and both ends of the second heat sink in a horizontal direction are positioned exterior of both ends of the heat receiver in the horizontal direction, and the first and second heat sinks are disposed on the first surface so as to sandwich the heat receiver and face each other,
a third heat sink and a fourth heat sink that are disposed on a second surface, the second surface being an outer surface of the housing and opposite to the first surface, the third and fourth heat sinks being disposed to face each other and dissipating the heat to the outside,
wherein the direction in which the first heat sink and the second heat sink face each other is orthogonal to the direction in which the third heat sink and the fourth heat sink face each other.

2. The vapor phase cooling apparatus according to claim 1, wherein a surface defining the internal space is subjected to surface roughening.

3. The vapor phase cooling apparatus according to claim 1, further comprising a first divider formed on a surface defining the internal space and in a direction parallel to the direction in which the first heat sink and the second heat sink face each other,
the first divider guiding the refrigerant that has boiled due to the heat to the vicinity of the first heat sink or the second heat sink.

4. The vapor phase cooling apparatus according to claim 1, comprising a fifth heat sink disposed on a surface defining the internal space, the fifth heat sink conducting heat from the heat receiver to the refrigerant.

5. A vapor phase cooling apparatus comprising:
a housing comprising a heat receiver configured to receive heat generated by an electronic component that is a heat source, the electronic component being connected to a first surface that is a vertical outer surface of the housing the housing having an internal space for enclosing refrigerant;
a first heat sink and a second heat sink that are disposed above and below the heat receiver, respectively, the first and second heat sinks dissipating the heat to the outside; and
a first divider formed on a surface defining the internal space and in a direction parallel to the direction in which the first heat sink and the second heat sink face each other, the first divider guiding the refrigerant that has boiled due to the heat to the vicinity of the first heat sink or the second heat sink,
wherein both ends of the first heat sink and both ends of the second heat sink in a horizontal direction are positioned exterior of both ends of the heat receiver in the horizontal direction,
wherein cooling wind is supplied from a predetermined direction to the first and second heat sinks,
the vapor phase cooling apparatus further comprising a second divider on a surface defining the internal space, the second divider being tilted relative to the supply direction of the cooling wind,
the second divider further guides the refrigerant guided by the first divider to a leeward direction of the cooling wind.

6. A vapor phase cooling apparatus comprising:
a housing comprising a heat receiver configured to receive heat generated by an electronic component that is a heat source, the electronic component being connected to a first surface that is a vertical outer surface of the housing, the housing having an internal space for enclosing refrigerant;
a first heat sink and a second heat sink that are disposed above and below the heat receiver, respectively, the first and second heat sinks dissipating the heat to the outside; and
a first divider formed on a surface defining the internal space and in a direction parallel to the direction in which the first heat sink and the second heat sink face each other, the first divider guiding the refrigerant that has boiled due to the heat to the vicinity of the first heat sink or the second heat sink,
wherein both ends of the first heat sink and both ends of the second heat sink in a horizontal direction are positioned exterior of both ends of the heat receiver in the horizontal direction,
wherein cooling wind is supplied from a predetermined direction to the first and second heat sinks, the vapor phase cooling apparatus further comprising a third divider on a surface defining the internal space, the third divider being parallel to the supply direction of the cooling wind, ends of windward side and leeward side of the third divider having openings formed, the area of the opening at the leeward side is larger than the area of the opening at the windward side.

7. The vapor phase cooling apparatus according to claim 6, wherein the third divider is approximately V-shaped having one corner.

8. The vapor phase cooling apparatus according to claim 7, wherein the corner is located at windward side rather than the center of the surface on which the third divider is disposed.

9. An electronic equipment comprising:
an electronic component that becomes a heat source by consuming power;
a vapor phase cooling apparatus according to claim 4 in which the electronic component and the heat receiver are thermally connected; and
a cooling wind supply unit configured to supply cooling wind to a first heat sink and a second heat sink of the vapor phase cooling apparatus.

\* \* \* \* \*